(12) United States Patent
Samal

(10) Patent No.: US 8,143,614 B2
(45) Date of Patent: Mar. 27, 2012

(54) GAN BASED LIGHT EMITTERS WITH BAND-EDGE ALIGNED CARRIER BLOCKING LAYERS

(75) Inventor: Ashmeet K Samal, Phoenix, AZ (US)

(73) Assignee: Dr. Samal's Lab LLC DE (US)

( * ) Notice: Subject to any disclaimer, the term of this patent is extended or adjusted under 35 U.S.C. 154(b) by 186 days.

(21) Appl. No.: 12/427,757

(22) Filed: Apr. 22, 2009

(65) Prior Publication Data

US 2010/0270531 A1 Oct. 28, 2010

(51) Int. Cl.
*H01L 29/06* (2006.01)

(52) U.S. Cl. .................. 257/13; 257/E33.025

(58) Field of Classification Search .......... 257/13, 257/E33.025
See application file for complete search history.

(56) References Cited

U.S. PATENT DOCUMENTS

| | | | |
|---|---|---|---|
| 7,745,841 B2 * | 6/2010 | Kuramoto | 257/96 |
| 2001/0030317 A1 * | 10/2001 | Lee et al. | 257/13 |

\* cited by examiner

*Primary Examiner* — Jerome Jackson, Jr.
*Assistant Examiner* — Jami M Valentine
(74) *Attorney, Agent, or Firm* — The Noblitt Group, PLLC

(57) ABSTRACT

Band-edge aligned carrier blocking layers are introduced into wurtzite or zinc blend Gallium Nitride based diode laser and LEDs in order to prevent thermionic emission and the overflow of carriers at elevated operating temperatures. These blocking layers are located in the direct vicinity of the active zone of the light emitter, and are designed with material composition such that one of the band-edges of the layers is, either partially or fully, aligned with that of adjacent barrier or waveguide layer. This invention proposes GaN based QW structure with a AlGaN(AsPSb) electron-blocking layer on the p-side of quantum well and (InGa)AlN as hole-blocking layer.

20 Claims, 33 Drawing Sheets

| Layer | Material | d(nm) |
|---|---|---|
| Cladding | $Al_{.07}Ga_{.93}N$ | 100 |
| Waveguide | GaN | 100 |
| Barrier | $In_{.035}Ga_{.965}N$ | 5 |
| Quantum Well | $In_{.1}Ga_{.9}N$ | 2 |
| Barrier | $In_{.035}Ga_{.965}N$ | 5 |
| Quantum Well | $In_{.1}Ga_{.9}N$ | 2 |
| Barrier | $In_{.035}Ga_{.965}N$ | 5 |
| Electron Blocking Layer | $Al_{.2}Ga_{.8}N$ | 20 |
| Waveguide | GaN | 100 |
| Cladding | $Al_{.07}Ga_{.93}N$ | 100 |

Fig. 33

GAN BASED LIGHT EMITTERS WITH BAND-EDGE ALIGNED CARRIER BLOCKING LAYERS

BACKGROUND OF THE INVENTION

1. Field of the Invention

This invention relates to light emitters, and more particularly, to nitride-semiconductor based light emitting devices with high power, high luminous efficiency and optical apparatus using the same.

2. Description of the Related Art

Nitride based semiconductor materials have drawn tremendous attention during last decade due to its enormous potential to be utilized in white lighting and high-power semiconductor devices. In a nitride semiconductor light emitting device, InGaN is often used for a quantum well (QW) layer included in its light emitting layer and it emits a wide range of colors from blue to orange just by adjusting the In content in InGaN QW. In recent years, blue, green and violet semiconductor light emitting diodes (LED) and lasers have been developed utilizing the characteristics of the nitride semiconductor light emitting devices.

For light generation in semiconductor lasers and LEDs, radiative recombination of electrons and holes in an active layer is used. The active layer can be a usual p-n junction, hetero-junction based on single quantum well or multiple quantum wells. For fabrication of a highly efficient device, the number of carriers recombined inside the active layer should be maximized and the number of carriers recombined, leaked or overflown outside the active layer should be minimized. This needs optimization of capture rates for electrons and holes into the active layer. Less confinement of electrons and holes would result in some of the electrons and holes not captured in the active layer to escape the active layer and recombine outside it. This results in low efficiency of these devices.

Moreover, the high temperature performance is keenly related to the amount of carriers, such as electrons and holes, confined in the active region. The threshold current ($I_{th}$) is the minimum current required to establish the population inversion necessary for lasing, and can be expressed by the following temperature-dependent formula:

$$I_{th}(T) = I_{th}(T_R) e^{(T-T_R)/T_o}, \quad [1]$$

where $T_o$ is the characteristic temperature, $I_{th}(T_R)$ is the threshold current at reference temperature and T is the operating temperature. The higher the value of $T_o$, less is the temperature dependence of the threshold current, higher is the stability of the laser during oscillation especially at high output power.

Typically, $T_o$ is in the range of about 160-170° K in the temperature range of 20° C. to 50° C. for a 1.5 mm-long InGaAs—AlGaAs single quantum-well (SQW) laser emitting at 980 nm (Weidmann et al. Journal of Quantum Electronics No. 1 Vol 38 2002). $T_o$ is supposed to be constant—at least within a certain temperature range—but depends on the effective cavity length of the laser. A corresponding relationship can be found for the temperature dependence of the differential quantum efficiency as a second characteristic temperature $T_1$. The differential quantum efficiency is linked to the mirror loss, the internal loss, and the internal quantum efficiency (all of which are assumed to be temperature-dependent, except for the mirror loss) by the equation. The temperature dependence of the mirror loss is neglected since the thermal expansion of the cavity is very small. In general, $T_1$ is a few times larger than $T_0$, and is about 560° K for the above-mentioned type of lasers.

The degradation of the electro-optical characteristics of quantum well lasers with increasing temperature is mainly attributed to thermionic emission and overflow of the carriers out of the quantum well (Ziel et al. Applied Physics Letters, vol 58, pp. 1437-1439, 1991). Because of the exponential dependence of the thermionic emission time on the barrier potential height of the quantum well (Jandelet et al. Proc. SPIE, vol 3626, pp. 217-229, 1999), increasing the barrier height seems to be the most effective way to increase the carrier confinement and, therefore, to improve high-temperature operation. The electrons are usually of major interest because of their much smaller effective mass and density of states in the quantum well.

One of the ways to increase the barrier height is to introduce high-band gap layers as quantum-well electron barriers. For InGaAs QWs on GaAs substrate, this is done by increasing the aluminum content of a typical AlGaAs barrier. However, this leads to a lower epitaxial quality and a higher thermal resistance for aluminum content up to 50%. Furthermore, to avoid a higher voltage drop and to keep the optical confinement factor constant, the aluminum content of the cladding layers also has to be raised, which further degrades the thermal and epitaxial quality. Superlattice barriers can also be used to realize large quantum well potential barriers, simultaneously having low average aluminum content. However, in an undoped state, they increase the series resistance and generate an additional voltage drop due to their limited electronic transport properties (Weidmann et al. Journal of Quantum Electronics No. 1 Vol 38 2002).

Since high optical output power demands minimized thermal and electrical resistance, increasing the quantum-well barrier height do not seem to be quite viable.

An alternative way to increase the electron confinement is to use carrier blocking layers (U.S. Pat. No. 5,764,668).

An Electron blocking layer, typically, is a layer inserted between the light emitting layer and the p-type waveguide layer (see FIG. 1). It has a wider band gap than the barrier material of the active region, with the purpose of preventing injected electrons from overflowing the active region. Similarly, hole blocking layer is a layer inserted between the light emitting layer and the n-type waveguide layer of the device. It has a wider band gap than the barrier material of the active region, with the purpose of preventing injected holes from overflowing the active region.

For GaAsSb based material system AlGaInP confinement layers have been suggested (U.S. Pat. No. 6,931,044) as the carrier blocking layers. Weidmann et al. have also demonstrated band-edge aligned quarternary AlGaInP as hole barrier and AlGaAsSb as electron barrier for an InGaAs QW on GaAs substrate (Journal of Quantum Electronics No. 1 Vol. 38, pp. 67-72 2002). The characteristic temperature of their laser structure was improved by about 50 to 60° K relative to a similar laser structure without the blocking layer. Additionally, the introduction of the blocking layer did not lead to any additional voltage drop or series resistance. The higher temperature stability of threshold current is mainly attributed to the suppression of carrier leakage and reduced free-carrier absorption at elevated temperatures by preventing thermionic emission and carrier overflow at elevated operating temperatures.

In GaN based material system meant for LEDs and lasers, either AlGaN or AlInGaN is routinely used as electron blocking layer (Piprek et al. Journal of Quantum Electronics No. 9 Vol 38 2002). The job of an electron blocking layer can be more vividly explained through the schematic diagram of FIG. 1. Electrons in the conduction band, under bias, are injected from n-type clad and waveguide. Drifting through n-type region they eventually fall into the quantum wells. Similarly, holes in the valence band, under bias, are injected from p-type clad and waveguide. Drifting through p-type waveguide layer they eventually rise in to the quantum wells. Electrons and holes radiatively recombine at the well to emit photons with a wavelength determined by the band-gap of the well layer. All the electrons and holes are supposed to recombine in the QWs. However, due to lighter mass and host of other reasons such as spontaneous and piezo-electric field in the well region, electrons tend to overflow the quantum wells and thus recombine with holes non-radiatively outside the wells. So the primary objective of the electron-blocking layer is to stop electrons from overflowing over the QW.

However, this electron blocking layer (AlGaN or AlInGaN) typically is not band-edge aligned to the barrier layer or waveguide layer. So it not only does block electrons in the conduction band, from overflowing to the p-side but also tends to block holes in the valence band from reaching the QW (See FIG. 1). In principle, an ideal carrier blocking layer is the one which blocks one type of carriers, either electrons or holes, and does not block the other.

The present invention is based on choosing right materials with precise compositions so that they are supposed to behave like ideal carrier blocker. FIG. 2 conceptually shows a schematic of a QW structure with band-aligned electron blocking layer in the n-side, which not only does block electrons in the conduction band but at the same time 'does not' block holes in the valence band. Similarly, FIG. 3 conceptually shows a schematic of a QW structure with band-aligned hole blocking layer in the p-side, which not only does block holes in the valence band but at the same time 'does not' block electrons in the conduction band. Additionally, FIG. 4 shows a schematic of a QW structure with both band-aligned electron blocking layer in the p-side, which is transparent to holes in the valence band and band-aligned hole blocking layer in the n-side, which is transparent to electrons in the conduction band.

SUMMARY OF THE INVENTION

This invention allows enhancement of the capture efficiency of electrons and holes into the active QW of nitride-based light emitters such as laser diodes and LEDs.

Embodiments of the present invention provide a method and apparatus for improving the power, temperature performance and efficiency of nitride based devices utilizing band-edge aligned carrier blocking layers.

The present invention employs materials for carrier blocking which block one type of carriers (holes or electrons) and do not block the other.

More specifically, the electron blocking layer acts as a blocker for electrons but is transparent to holes and hole blocking layer acts as a blocker for holes but is transparent to electrons.

$Al_aGa_bIn_{(1-a-b)}N_xAs_yP_zSb_{(1-x-y-z)}$ materials have been chosen to act as an electron blocker, where a, b, x, y and z are optimally determined from band theory to band-align, or in other words band line-up, either completely or partially, its valence band edge with that of either barrier or waveguide layer of the structure while keeping higher conduction band edge than that of barrier or waveguide layer $Al_cGa_dIn_{(1-c-d)}N$ materials have been chosen to act as hole blocker, where c and d are optimally determined from band theory to band-align, or in other words band line-up, either completely or partially, its the conduction band edge with that of either a barrier or waveguide layer of the structure while keeping valence band edge lower than that of barrier or waveguide layer.

The molar composition of a, b, c, d, x, y and z are optimally chosen to have minimum overall permissible strain and piezo-electric effect on the composite structure.

Both blocking layers have significantly higher band gap than the barrier and waveguide layers and thereby facilitating effective carrier confinement in the quantum well.

Many of these features and advantages are apparent from the description below with reference to the following drawings.

BRIEF DESCRIPTION OF THE DRAWINGS

Table 1 shows a typical QW structure of a GaN based device. (Chen et al. Journal of Lightwave Technology No. 3 Vol. 26 2008)

FIG. 33 shows a typical QW structure of a GaN based device. (Chen et al. Journal of Lightwave Technology No. 3 Vol. 26 2008).

DETAILED DESCRIPTION OF THE INVENTION

Figure 5:
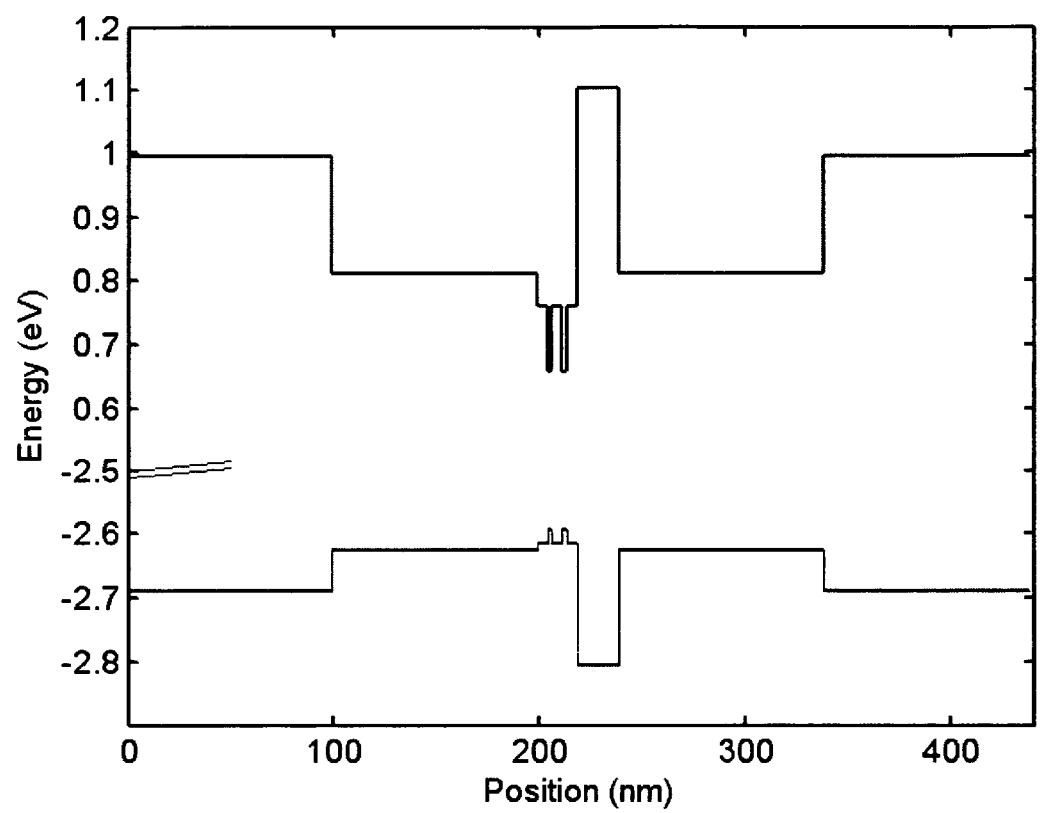
FIG. 5 is an exemplary simulated energy band diagram of a light emitter QW structure as listed in FIG. 33, in wurtzite form, with a typical $Al_{0.2}Ga_{0.8}N$ electron blocking layer.

In case of GaN based system, as briefly discussed earlier, AlGaN or InAlGaN layers are typically used as electron blocking layers. However, these layers also block holes in the valence band from reaching the QW, which leads to lowering of internal quantum efficiency in the QW. Moreover, hole-blocking by electron-blocking layer naturally becomes more severe with increasing Al-content in the blocking layer as increasing Al content increases both conduction and valence band offset relative to barrier or waveguide layer. Typical Al content in AlGaN electron blocking layer is around 0.2. The simulated energy band diagram of a typical customary structure (Chen et al. Journal of Lightwave Technology No. 3 Vol. 26 2008) is shown in FIG. 5. Constraints of not choosing higher Al-containing electron blocking layers lead to efficiency-drooping and lower temperature performance due to carrier overflow and non-radiative recombination, which becomes much more severe at higher current injection.

In order to achieve a larger quantum-well potential barrier height in case of GaN based material system and to circumvent the problem of introducing additional thermal or series resistance, band-edge aligned carrier blocking layers are proposed in this invention.

In accordance with the invention, on the n-side of the QW, a hole-blocking layer consisting of AlGaInN is implemented by choosing right composition of Al, Ga and In. On the p-side of the QW, an electron blocking layer consisting of InAlGaN-PAsSb is implemented by choosing right compositions of In, Ga, P, As, Sb to be added to the typical AlGaN electron blocking layer.

Furthermore, in this embodiment, the composition of electron blocking layer is chosen so that its valence-band edge is, either partially or fully, aligned with the valence band-edge of the adjacent waveguide or barrier layer in the QW structure while maintaining higher conduction band edge than that of adjacent barrier or waveguide layer, thus providing a transparent or un-obstructive path for holes to reach quantum well and simultaneously blocking the electrons from overflowing (or leaking) from the quantum well.

Similarly the composition of hole-blocking layer is chosen so that its conduction band-edge is, either partially or fully, aligned with the conduction band-edge of waveguide or barrier layer while maintaining lower valence band edge than that of the adjacent barrier or waveguide layer, thus providing a transparent or un-obstructive path for electrons to reach quantum well and simultaneously blocking the holes from overflowing (or leaking) from the quantum well.

The content of each constituent of the carrier blocking layers can be calculated by using the model-solid theory (Vurgaftman et al. Journal of Applied Physics, vol. 89 #11 Jun. 2001, Vurgaftman et al. Journal of Applied Physics, vol. 94 #6, September 2003).

Although not shown in the figure, the electron blocking layer can be placed right adjacent to the quantum well. In this case also, the valence-band edge of the electron-blocking layer is, either partially or fully, band-edge-aligned with valence band-edge of a barrier layer situated in between two quantum wells or the valence band-edge of adjacent waveguide layer. Similarly, the conduction-band edge of the hole blocking layer can be, either partially or fully, band-edge-aligned with the conduction band-edge of a barrier layer situated in between two quantum wells or the valence band-edge of adjacent waveguide layer.

Figure 1:
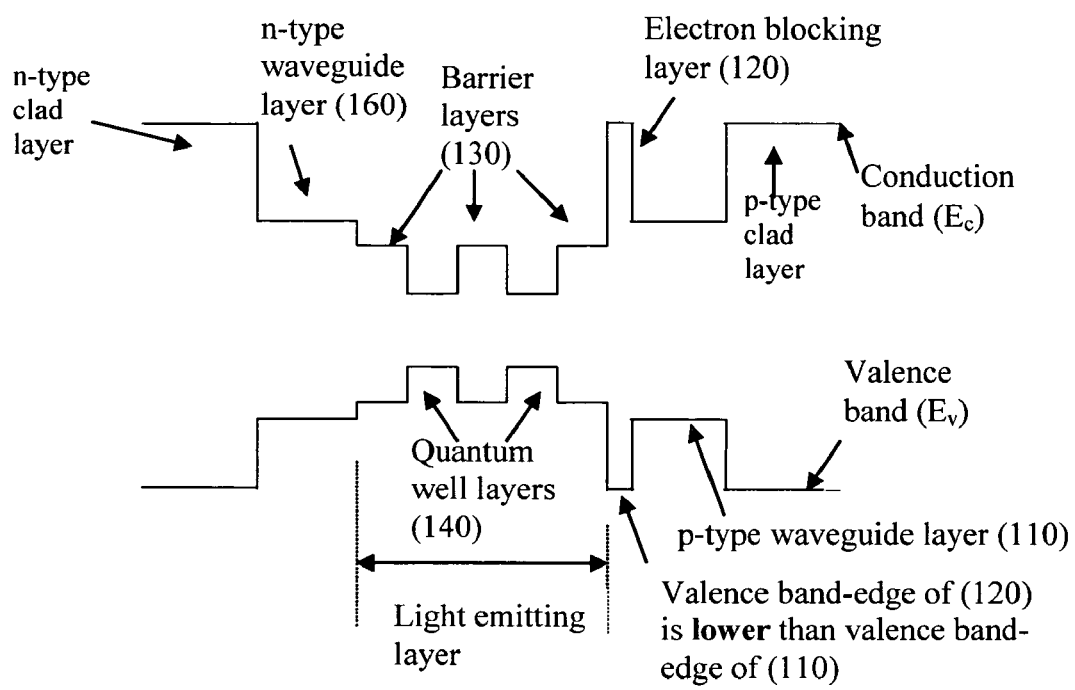
FIG. 1 is a schematic energy band diagram of a typical light emitter QW structure.

FIG. 1 shows the schematic energy band diagram of a typical light emitter QW device according to prior art. The structure consists of an active region comprising of alternate layers of Quantum well layer(s) (140) and barrier layer(s) (130). The quantum well layers in a GaN based device are generally formed of GaN or InGaN or InAlGaN, and the barrier layers generally consist of GaN or InGaN or AlGaN or InAlGaN or InAlGaNAs or InAlGaNP or InAlGaNSb. Although two quantum wells and three barrier layers are shown in the schematic, the device may contain single or more than two quantum wells. The device also consists of p-type and n-type cladding layers, p-type waveguide layer (110) and n-type waveguide layer (160). The electron blocking layer (120) may be adjacent to barrier layer (130) as shown in the diagram or to quantum well layer (140).

Electrons reside in the conduction band, whose band-edge is shown by ($E_c$), while holes reside in the valence band, whose band-edge is shown by ($E_v$). The vertical height of the conduction band represents the potential barrier of electrons. The higher the band position, the higher the potential of electrons. For the valence band, it is just the opposite, i.e., the higher of the band position, the lower the potential of holes. Carriers (electrons and holes) stay in low potential until extra energy is provided to go to a higher potential position.

Layer (120), electron blocking layer, generally comprising of AlGaN or InAlGaN, has a higher conduction band potential ($E_c$) than the adjacent barrier layer (130), thus blocking the electrons from leaking from the quantum well. But in the prior art, the valence band edge ($E_v$) of the layer (120) is also lower than the valence band edge of the barrier layer (130) or p type cladding layer (110) thus blocking the holes in the valence band from reaching the QW, which are injected from p-side. Moreover, it does not contain any layer to stop holes from leaking out from the quantum well.

Figure 2:
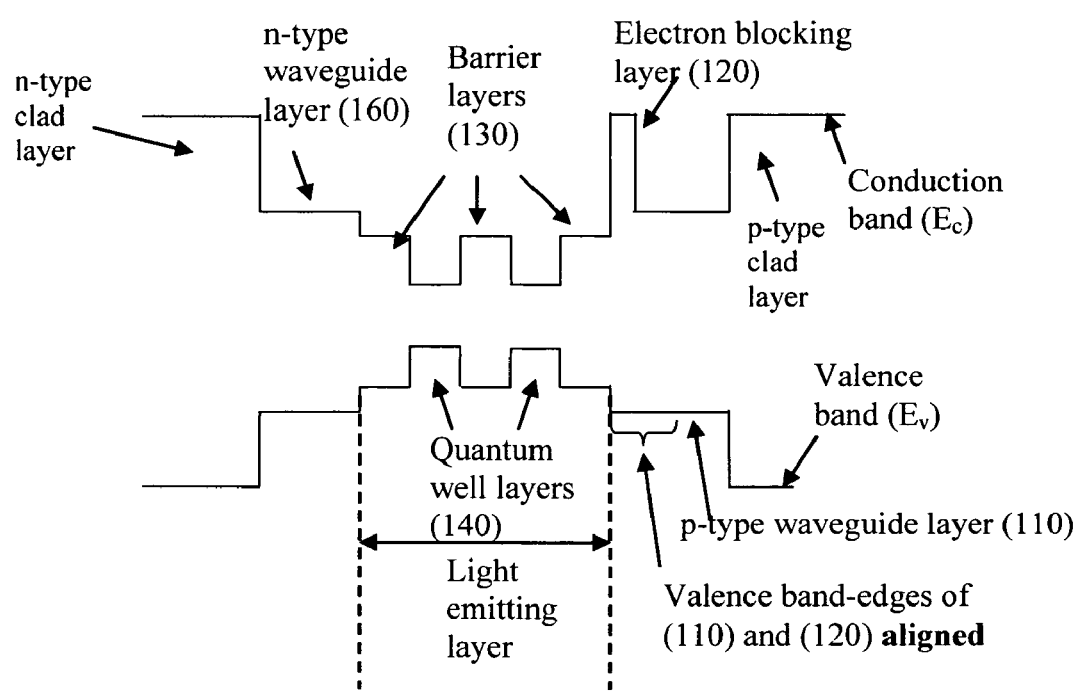
FIG. 2 is a schematic energy band diagram of a typical light emitter QW structure with band-edge aligned electron blocking layer in accordance with the invention.

FIG. 2 shows one embodiment of the invention. Appropriate amount of Sb, As or P is added to electron blocking layer (120) so that its valence-band edge ($E_v$) aligns fully with that of the adjacent waveguide layer (110) thus providing a transparent or un-obstructive path for holes to reach quantum well. The conduction band edge ($E_c$) of layer (120) is still maintained to be higher than that of adjacent barrier layer (130) or waveguide layer (110), providing a potential barrier for electrons from leaking or overflowing from the quantum well.

Figure 3:
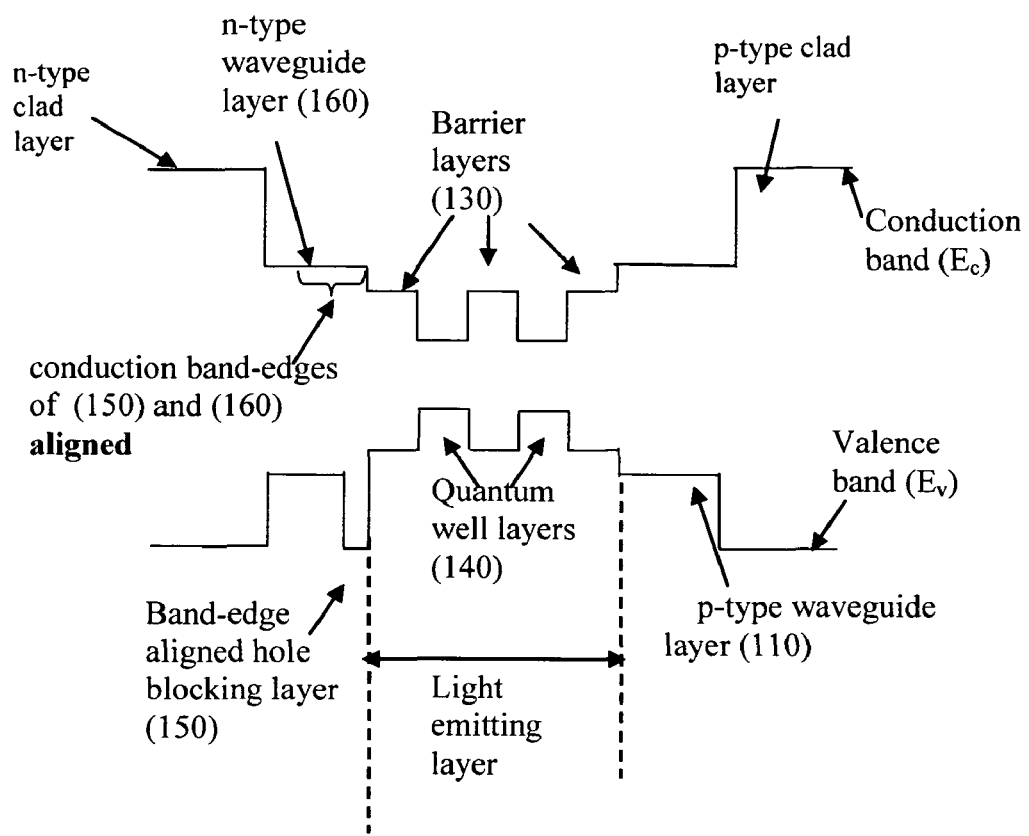
FIG. 3 is a schematic energy band diagram of a typical light emitter QW structure with band-edge aligned hole blocking layer in accordance with the invention.

FIG. 3 shows another embodiment of the invention. A hole blocking layer (150) is added adjacent to the n type waveguide layer (160). This layer, comprising of (InAlGa)N, has its conduction band edge ($E_c$) aligned completely with that of n-type waveguide layer (160), thus providing a transparent or un-obstructive path for electrons to reach the quantum well. The valence band edge ($E_v$) of layer 150 is however, kept lower than the valence band edge of barrier layer (130) or waveguide layer (160) thus blocking the holes from leaking or overflowing from the quantum well.

Figure 4:
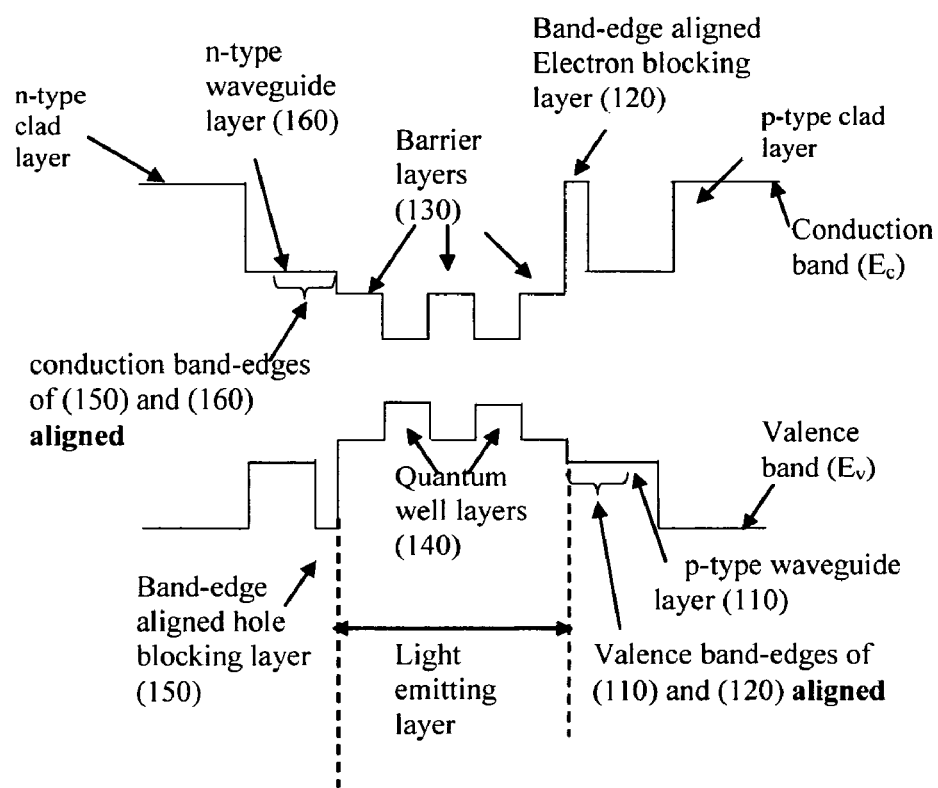
FIG. 4 is a schematic energy band diagram of a typical light emitter QW structure with both band-edge aligned electron blocking layer and band-edge aligned hole blocking layer in accordance with the invention.

FIG. 4 shows another embodiment of the invention. It shows a schematic of a QW structure with both, band-aligned electron blocking layer in the p-side, which is transparent to holes and band-aligned hole blocking layer in the n-side, which is transparent to electrons. The electron blocking layer (120) has its valence band-edge ($E_v$) aligned fully with valence band-edge of the adjacent waveguide layer (110). The conduction band edge ($E_c$) of layer (120) is still maintained to be higher than that of adjacent barrier layer (130) or waveguide layer (110). The hole blocking layer (150) has its conduction band edge ($E_c$) aligned fully with conduction band-edge of n-type waveguide layer (160). The valence band edge ($E_v$) of layer (150) is however, kept lower than the valence band-edge of barrier layer (130) or waveguide layer (160) thus help blocking the holes from leaking or overflowing from the quantum well For purposes of exemplifying the invention, FIG. 5-FIG. 21 show the simulations based on parameters of wurtzite nitride structure assuming that dilution of blocking layers by addition of P, As, Sb does not drastically change the crystal structure from hexagonal to cubic. Table 1 shows a reference QW structure. (Chen et al. Journal of Lightwave Technology No. 3 Vol. 26 2008)

Figure 6:
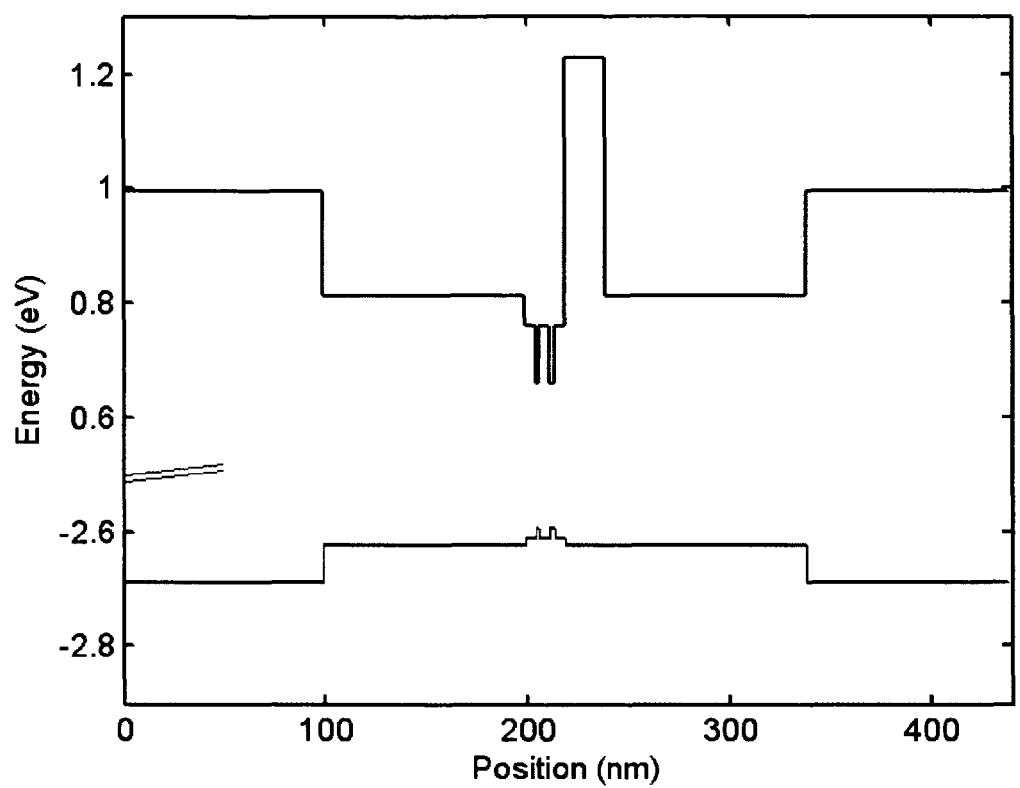
FIG. 6 shows an exemplary simulated energy band diagram of reference QW structure in wurtzite form, as listed in FIG. 33, with band-edge aligned electron blocking layer using $Al_{0.2}Ga_{0.8}N_{0.93}Sb_{0.07}$ in accordance with the invention.
Figure 7:
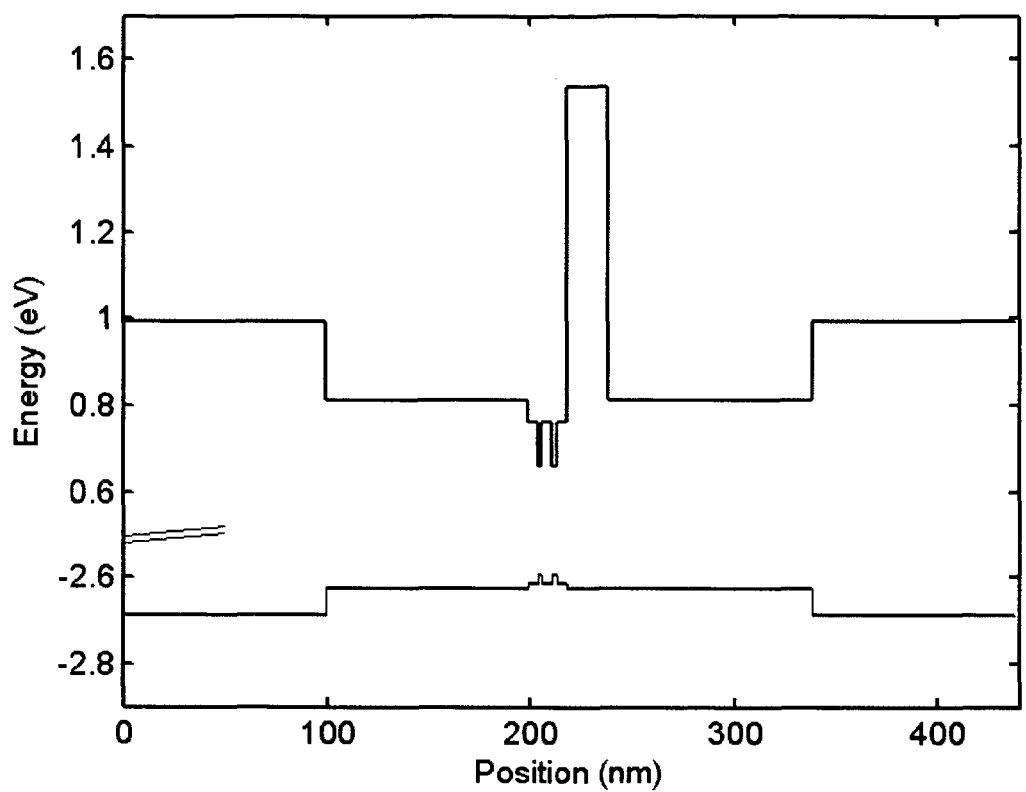
FIG. 7 shows an exemplary simulated energy band diagram of reference QW structure in wurtzite form, as listed in FIG. 33, with band-edge aligned electron blocking layer using $Al_{0.4}Ga_{0.6}N_{0.865}Sb_{0.135}$ in accordance with the invention.
Figure 8:
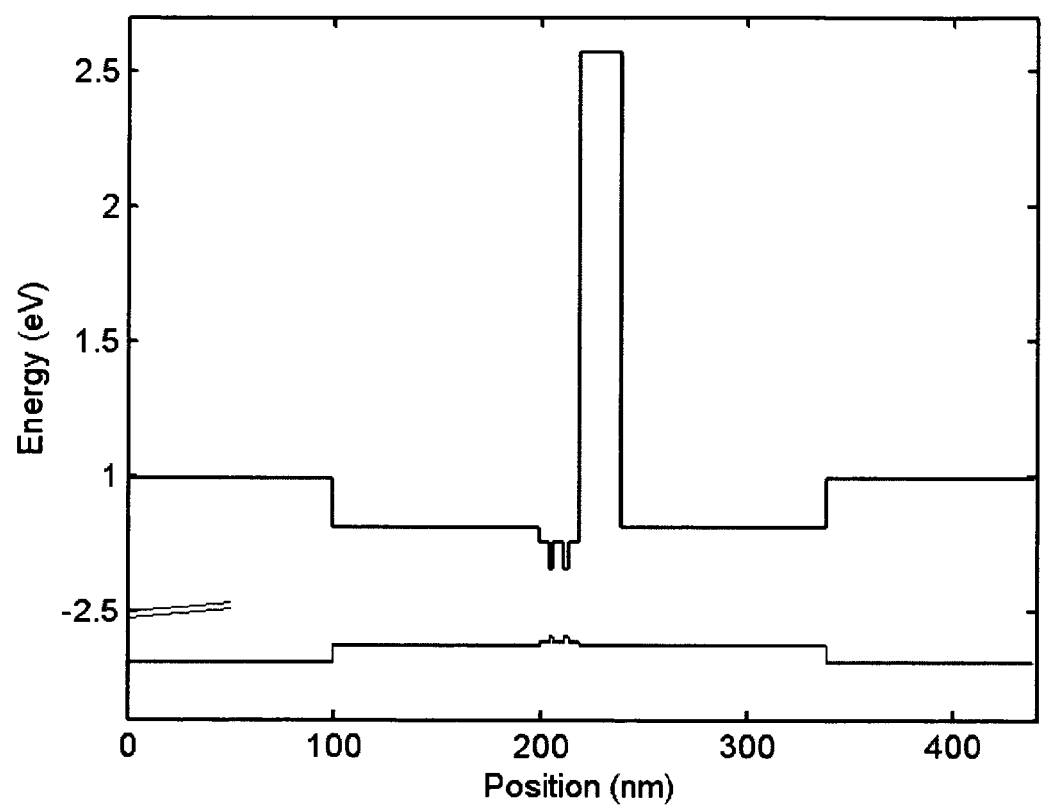
FIG. 8 shows simulated energy band diagram of reference QW structure in wurtzite form, as listed in FIG. 33, with band-edge aligned electron blocking layer using $AlN_{0.687}Sb_{0.313}$ in accordance with the invention.

In accordance with the invention, FIG. 6-FIG. 8 illustrate a simulated band diagram of such a QW structure with valence band-edge of the electron blocking layer aligned to the valence band-edge of adjacent waveguide layer using Sb. FIG. 6 illustrates complete alignment of valence band with that of waveguide layer using $Al_{0.2}Ga_{0.8}N_{0.93}Sb_{0.07}$ The potential barrier height of the electron blocking layer is, however, almost maintained despite the addition of Sb to the layer. Increasing Al content from 20% to 40% in the AlGaN electron blocking layer increases potential barrier height for both electrons and holes and thus requires more Sb (13.5%) in the group V compounds to completely line-up its valence band-edge with that of adjacent waveguide layer as illustrated in FIG. 7. Even adding 100% Al in the electron blocking layer still lines up the valence band edge by mere addition of 31.3% of Sb. The amount of Sb in the blocking layer must be determined by also taking in to account number of other factors such as strain and its effect on overall piezo-electric field, defect density and its overall impact on the quality of epitaxy.

Figure 9:
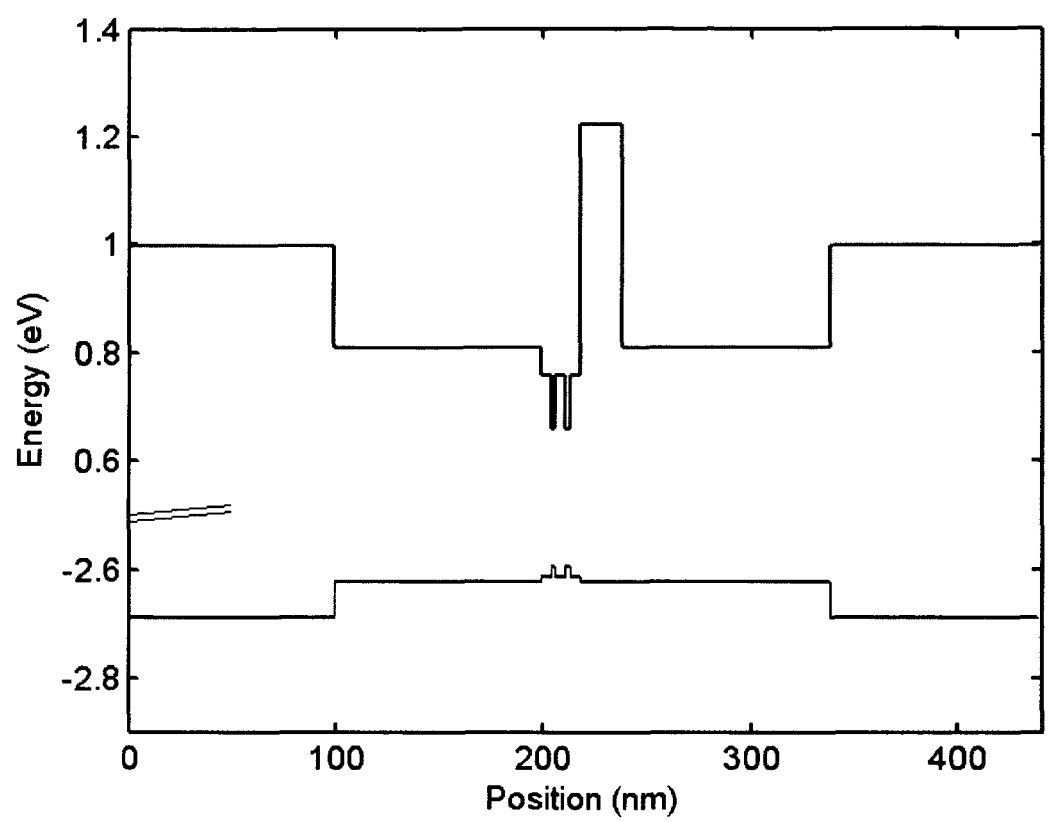
FIG. 9 shows an exemplary simulated energy band diagram of reference QW structure in wurtzite form, as listed in FIG. 33, with band-edge aligned electron blocking layer using $Al_{0.2}Ga_{0.8}N_{0.896}As_{0.104}$ in accordance with the invention.
Figure 10:
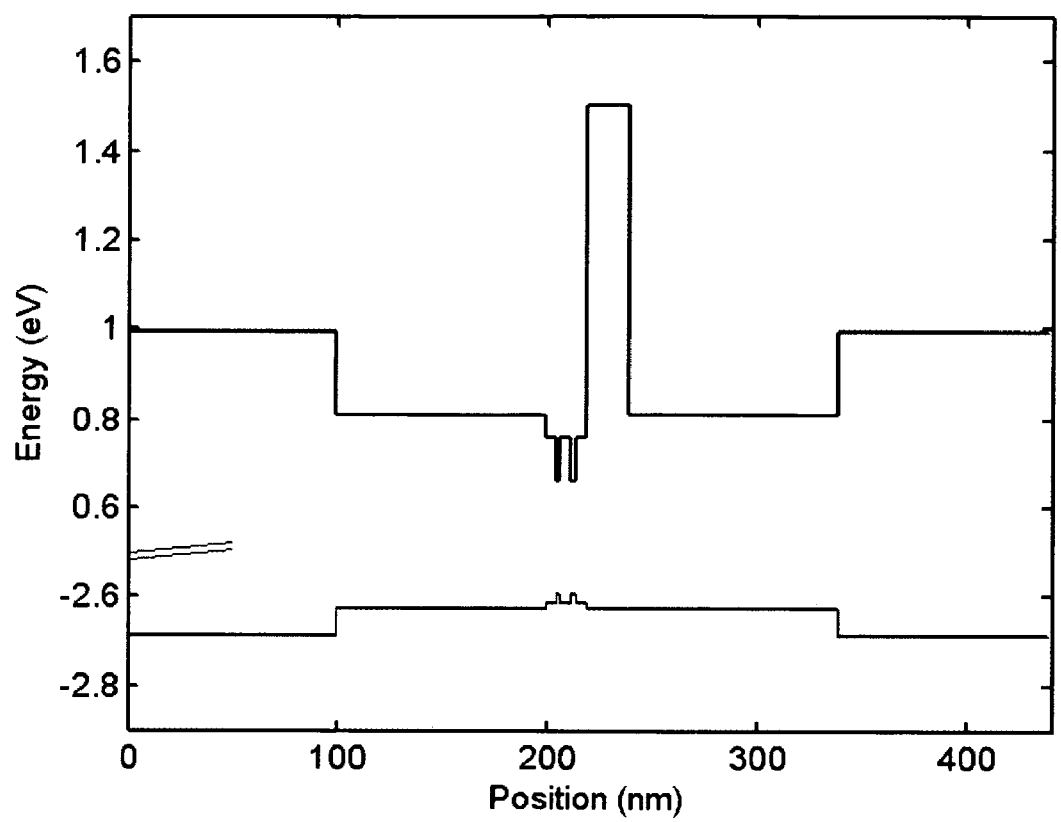
FIG. 10 shows an exemplary simulated energy band diagram of reference QW structure in wurtzite form, as listed in FIG. 33, with band-edge aligned electron blocking layer using $Al_{0.4}Ga_{0.6}N_{0.8}As_{0.2}$ in accordance with the invention.
Figure 11:
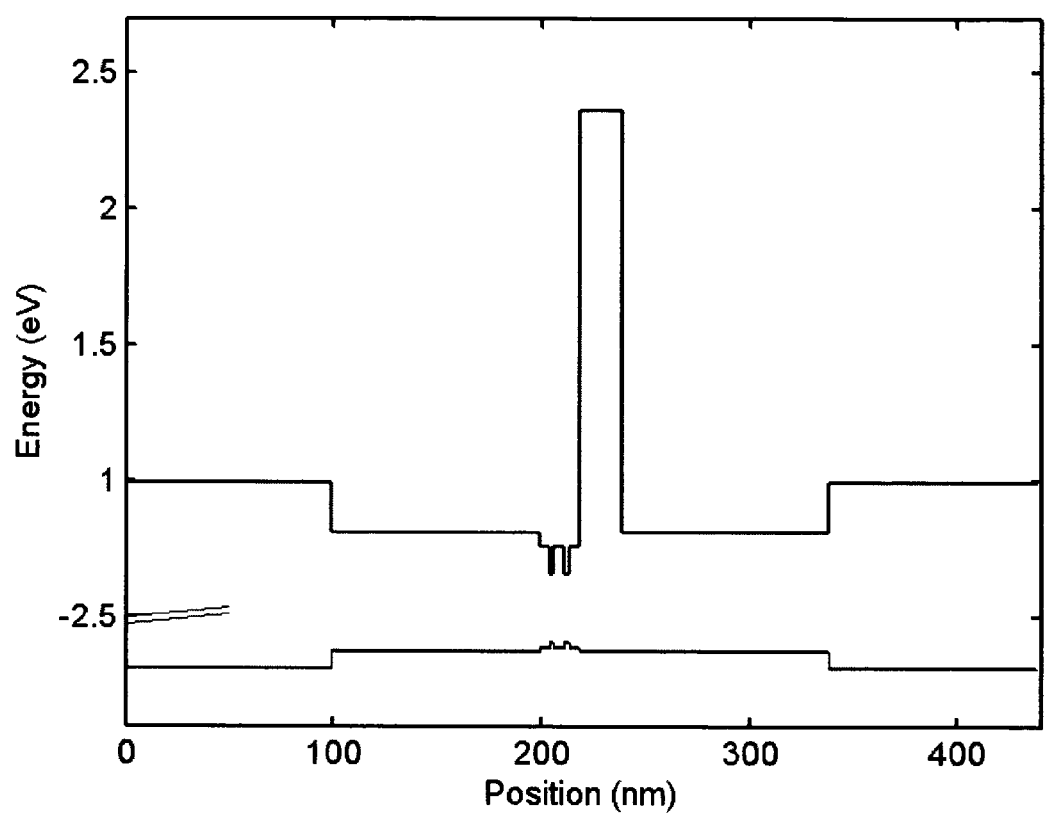
FIG. 11 shows an exemplary simulated energy band diagram of reference QW structure in wurtzite form, as listed in FIG. 33, with band-edge aligned electron blocking layer using $AlN_{0.538}As_{0.462}$ in accordance with the invention.

In another embodiment, addition of As in AlGaN electron blocking layer helps align the valence band-edge with that of the adjacent waveguide layer. More the content of Al in the layer, more As needed for full alignment. As illustrated in FIG. 9-FIG. 11, addition of 10.4%, 20% and 46.2% of As in group V help line-up the valence band of the electron blocking layer with 20%, 40% and 100% Al respectively.

Figure 12:
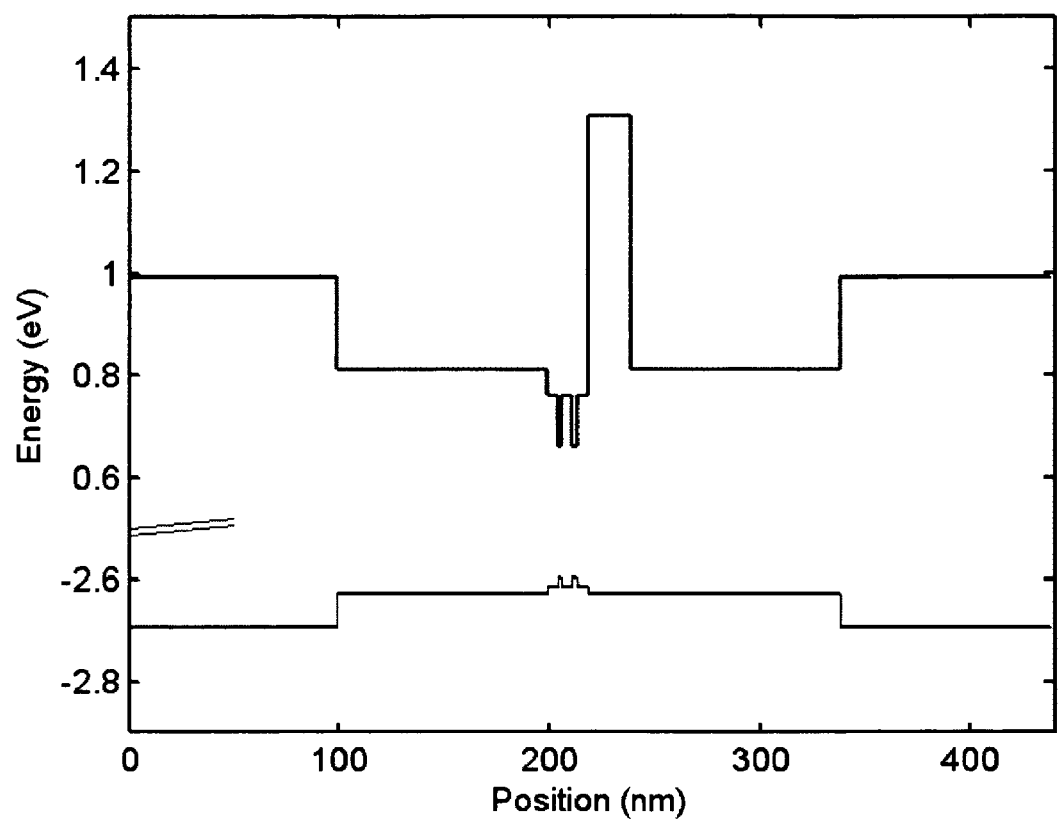
FIG. 12 shows an exemplary simulated energy band diagram of reference QW structure in wurtzite form, as listed in FIG. 33, with band-edge aligned electron blocking layer using $Al_{0.2}Ga_{0.8}N_{0.865}PO_{0.135}$ in accordance with the invention.
Figure 13:
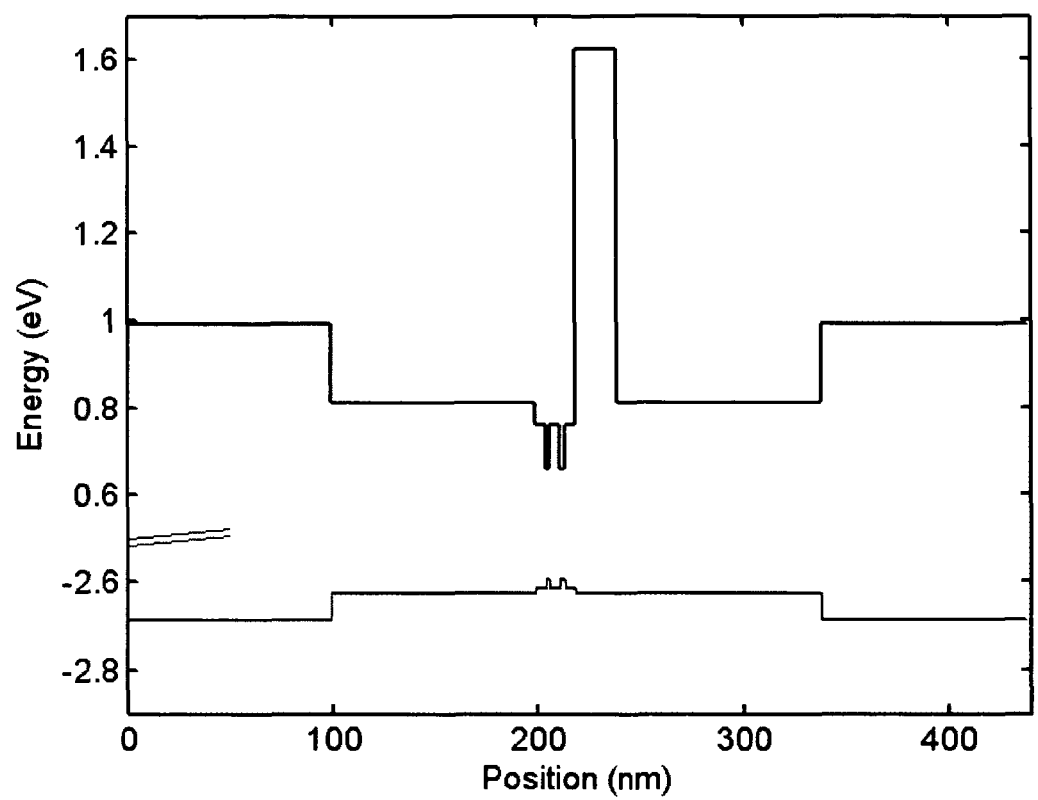
FIG. 13 shows an exemplary simulated energy band diagram of reference QW structure in wurtzite form, as listed in FIG. 33, with band-edge aligned electron blocking layer using $Al_{0.4}Ga_{0.6}N_{0.74}PO_{0.26}$ in accordance with the invention.
Figure 14:
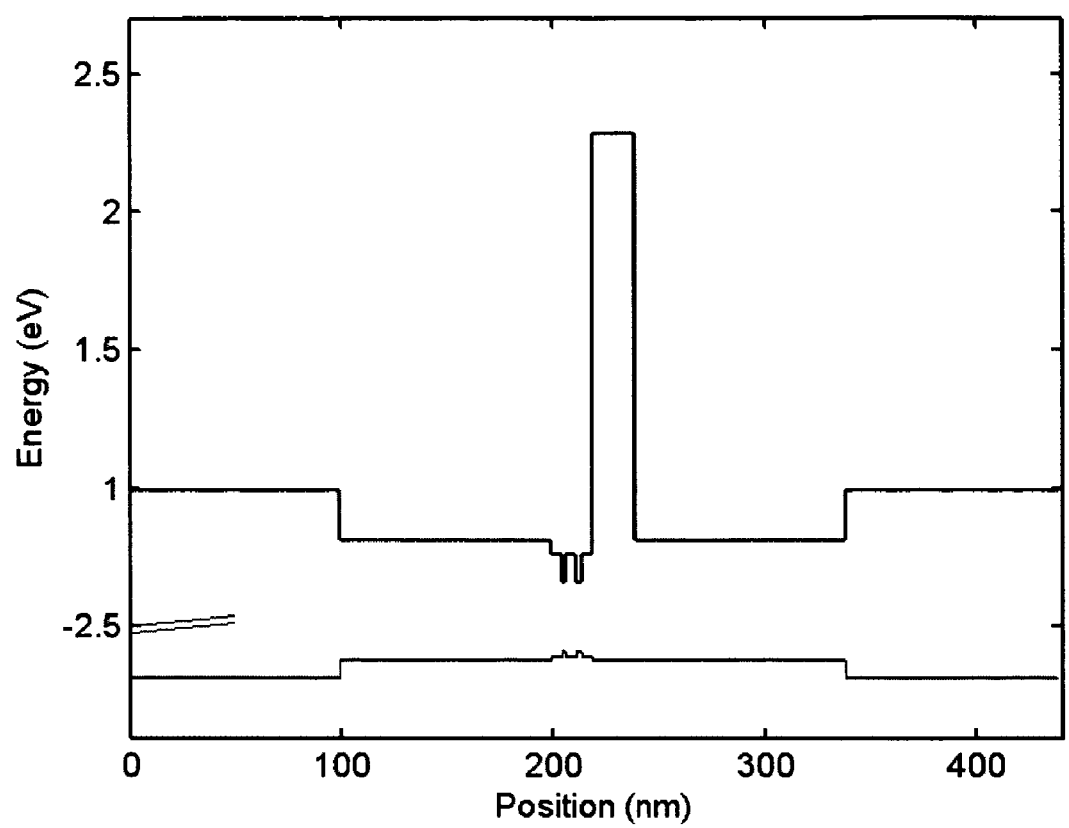
FIG. 14 shows an exemplary simulated energy band diagram of reference QW structure in wurtzite form, as listed in FIG. 33, with band-edge aligned electron blocking layer using $AlN_{0.425}P_{0.575}$ in accordance with the invention.

Another embodiment of the invention is illustrated in FIG. 12-FIG. 14, where addition of 13.5%, 26% and 57.5% of P in group V help line-up the valence band of the electron blocking layer containing 20%, 40% and 100% Al respectively with that of adjacent waveguide layer.

Figure 15:
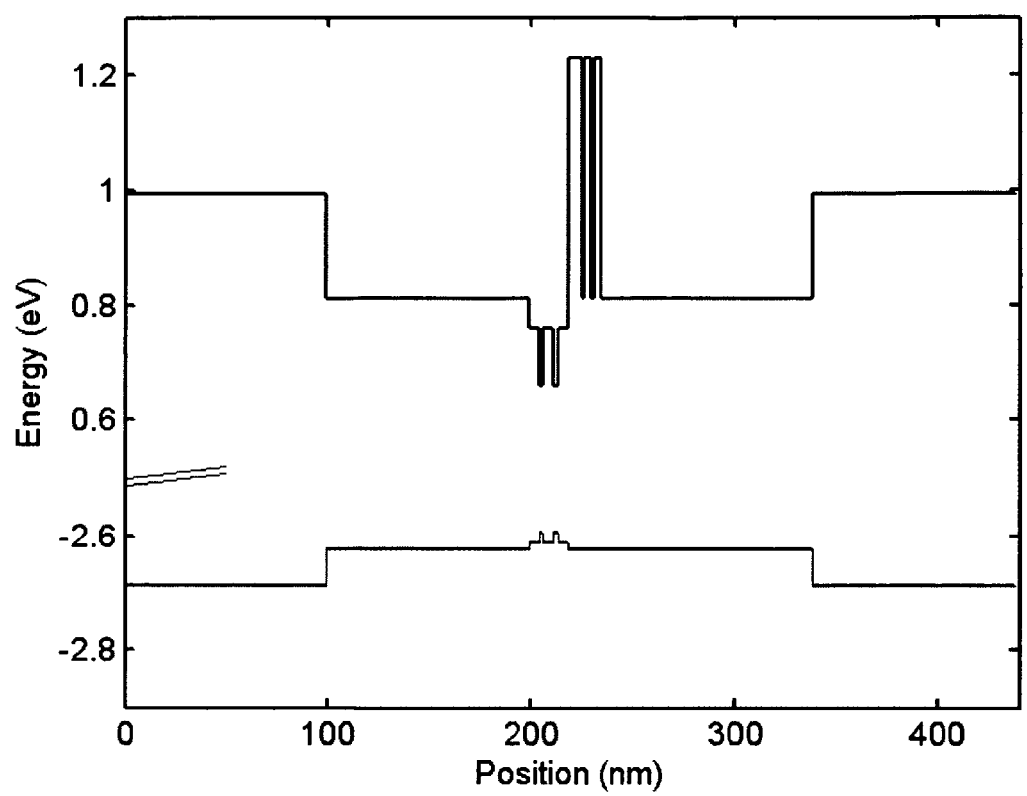
FIG. 15 shows an exemplary simulated energy band diagram of reference QW structure in wurtzite form, as listed in FIG. 33, with band-edge aligned multiple of electron blocking layers (superlattice) using $Al_{0.2}Ga_{0.8}N_{0.93}Sb_{0.07}$ in accordance with the invention.

An exemplification of plurality of band aligned electron blocking layer using Sb is demonstrated by simulation of a superlattice electron blocking structure in FIG. 15.

In accordance with the invention, a combination of As, Sb and P can also be used in single or multiple electron blocking layers to partially or fully align the valence band-edge.

Figure 16:
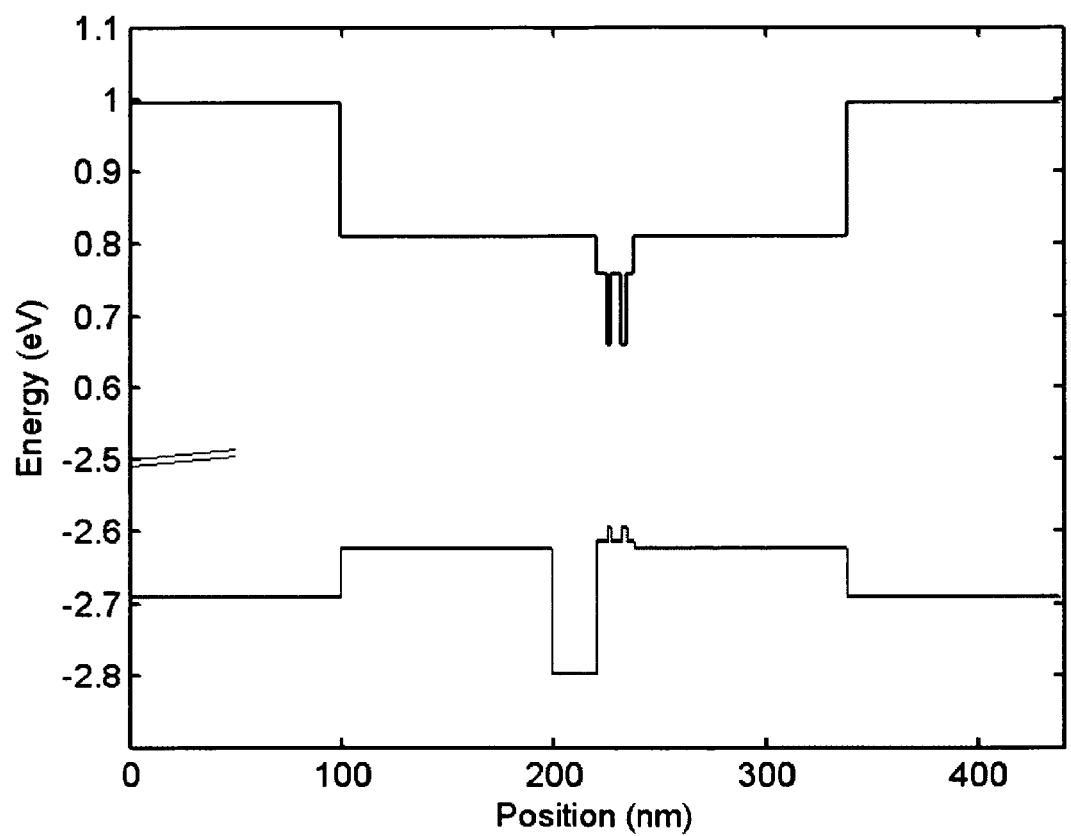
FIG. 16 shows an exemplary simulated energy band diagram of reference QW structure in wurtzite form, as listed in FIG. 33, with band-edge aligned hole blocking layer using $In_{0.142}Al_{0.2}Ga_{0.658}N$ in accordance with the invention.
Figure 17:
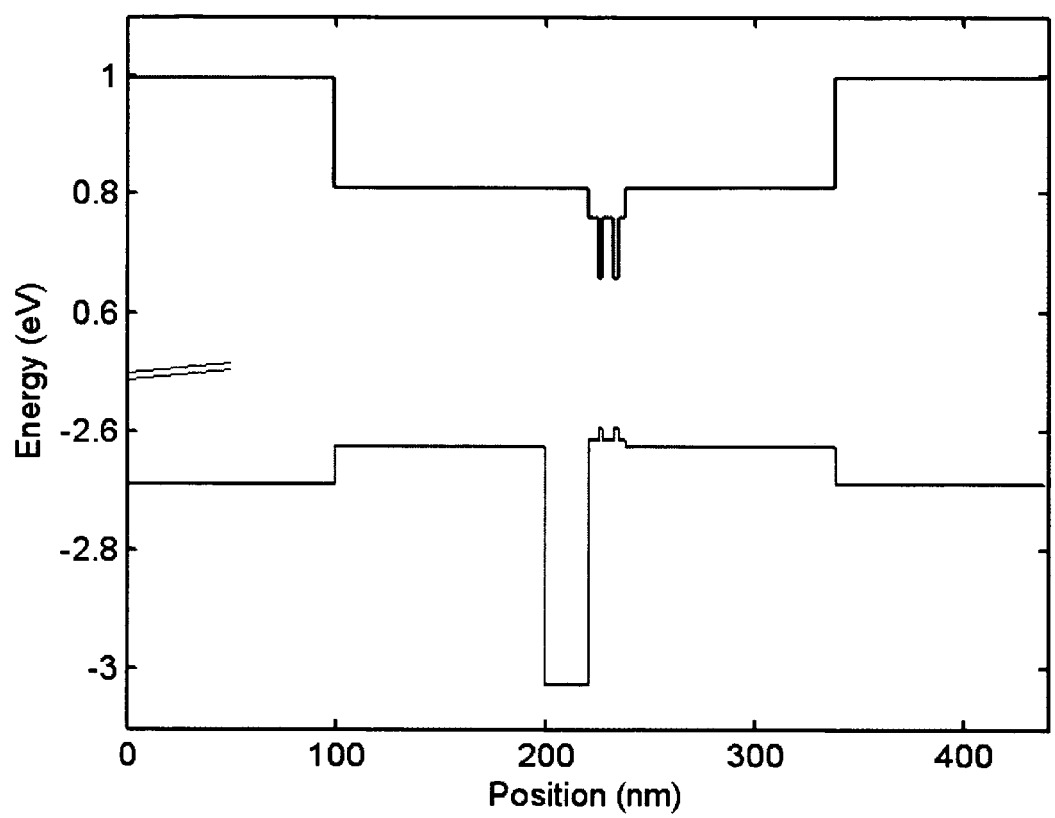
FIG. 17 shows an exemplary simulated energy band diagram of reference QW structure in wurtzite form, as listed in FIG. 33, with band-edge aligned hole blocking layer using $In_{0.326}Al_{0.4}Ga_{0.274}N$ in accordance with the invention.
Figure 18:
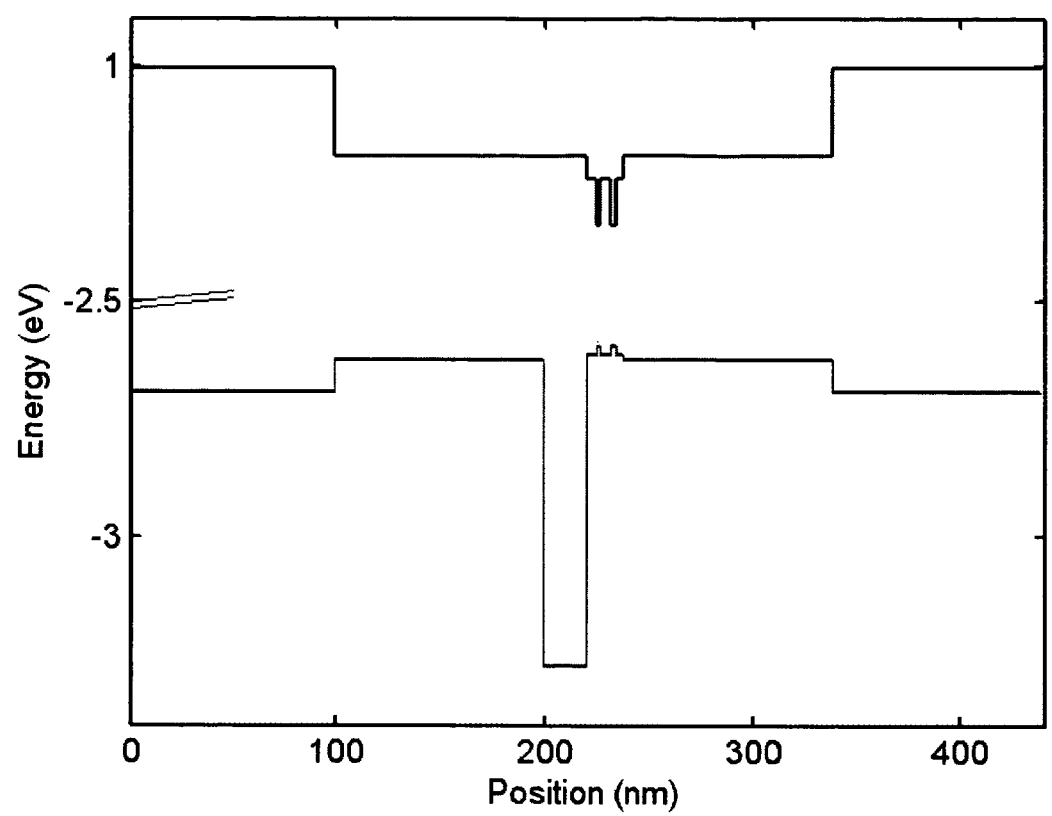
FIG. 18 shows an exemplary simulated energy band diagram of reference QW structure in wurtzite form, as listed in FIG. 33, with band-edge aligned hole blocking layer using $In_{0.41}Al_{0.59}N$ in accordance with the invention.

In another embodiment, illustrated in FIG. 16-FIG. 18, In, in various compositions, is used to line-up the conduction band edge of a proposed hole-blocking layer to that of the adjacent waveguide layer. As seen in the simulations, 14.2% of In is needed for 20% Al in the InAlGaN hole blocking layer to completely band-align the conduction band-edge of the hole blocking layer with that of adjacent GaN waveguide layer. Similarly, 32.6% of In is needed to be added in the hole blocking layer containing 40% Aluminum to band-align its conduction band-edge to the conduction band-edge of the adjacent waveguide layer. Complete absence of Ga in the hole blocking layer needs 41% of In to band-align the conduction band-edge with that of the waveguide layer.

Figure 19:
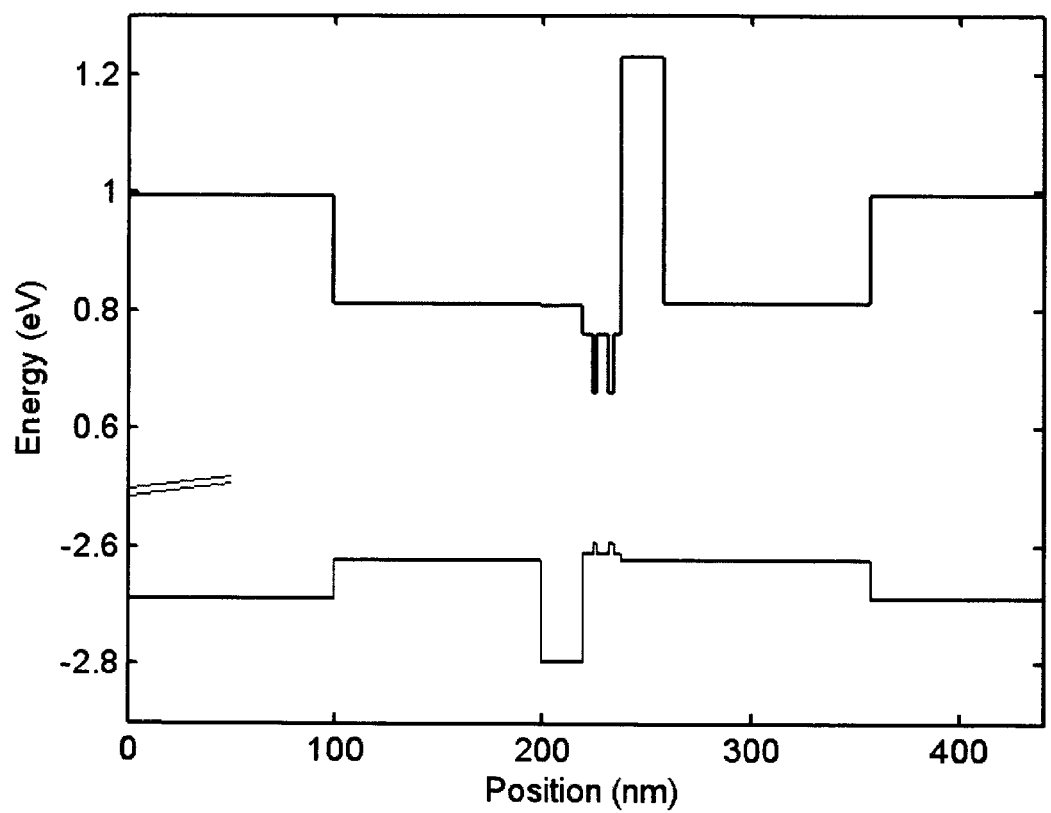
FIG. 19 shows an exemplary simulated energy band diagram of reference QW structure in wurtzite form, as listed in FIG. 33, with band-edge aligned electron blocking layer using $Al_{0.2}Ga_{0.8}N_{0.93}Sb_{0.07}$ and band-edge aligned hole blocking layer using $In_{0.142}Al_{0.2}Ga_{0.658}N$ in accordance with the invention.
Figure 20:
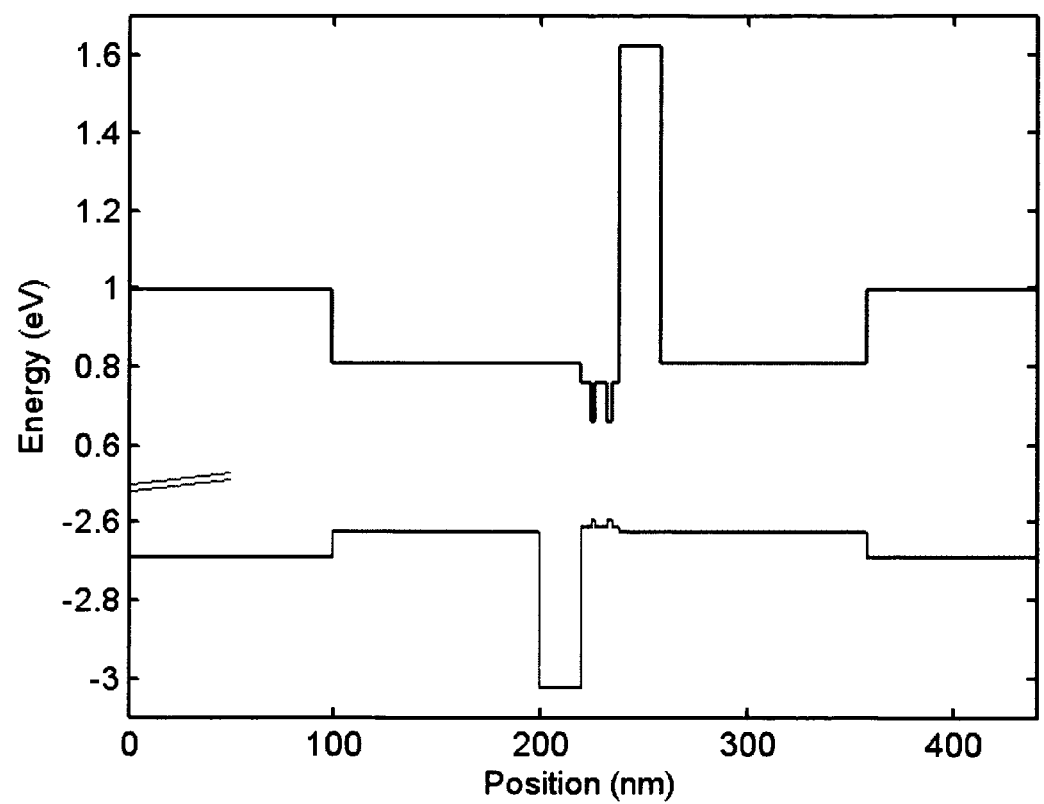
FIG. 20 shows an exemplary simulated energy band diagram of reference QW structure in wurtzite form, as listed in FIG. 33, with band-edge aligned electron blocking layer using $Al_{0.4}Ga_{0.6}N_{0.74}P_{0.26}$ and band-edge aligned hole blocking layer using $In_{0.326}Al_{0.4}Ga_{0.274}N$ in accordance with the invention.
Figure 21:
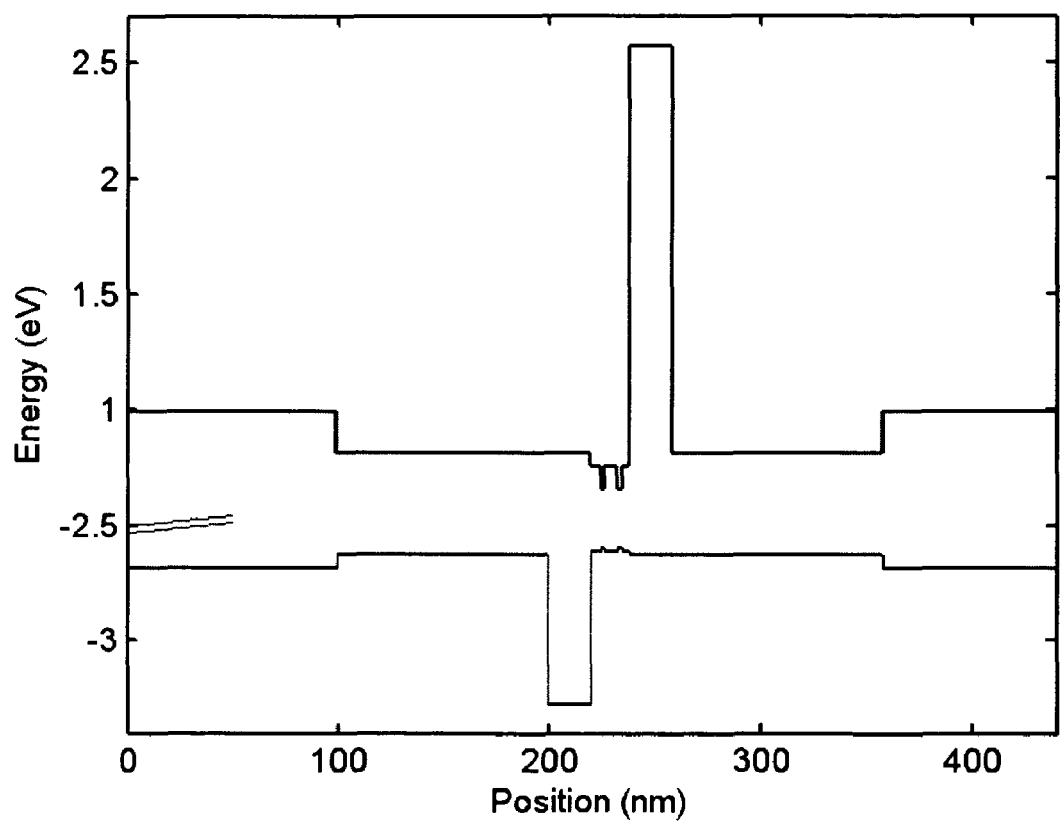
FIG. 21 shows an exemplary simulated energy band diagram of reference QW structure in wurtzite form, as listed in FIG. 33, with band-edge aligned electron blocking layer using $AlN_{0.687}Sb_{0.313}$ and band-edge aligned hole blocking layer using $In_{0.41}Al_{0.59}N$ in accordance with the invention.

Another embodiment of the invention is illustrated in FIG. 19-FIG. 21, where both electron blocking layer and hole blocking layers are simulated for various compositions of Al in the blocking layers. In such a structure, minimum carrier leakage and free-carrier absorption is expected at elevated temperatures and also at higher injection.

FIG. 19 shows simulated energy band diagram of reference QW structure with band-edge aligned electron blocking layer using $Al_{0.2}Ga_{0.8}N_{0.93}Sb_{0.07}$ and band-edge aligned hole blocking layer using $In_{0.142}Al_{0.2}Ga_{0.658}N$.

FIG. 20 shows simulated energy band diagram of reference QW structure with band-edge aligned electron blocking layer using $Al_{0.4}Ga_{0.6}N_{0.74}P_{0.26}$ and band-edge aligned hole blocking layer using $In_{0.326}Al_{0.4}Ga_{0.274}N$.

FIG. 21 shows simulated energy band diagram of reference QW structure with band-edge aligned electron blocking layer using $AlN_{0.687}Sb_{0.313}$ and band-edge aligned hole blocking layer using $In_{0.41}Al_{0.59}N$.

Figure 22:
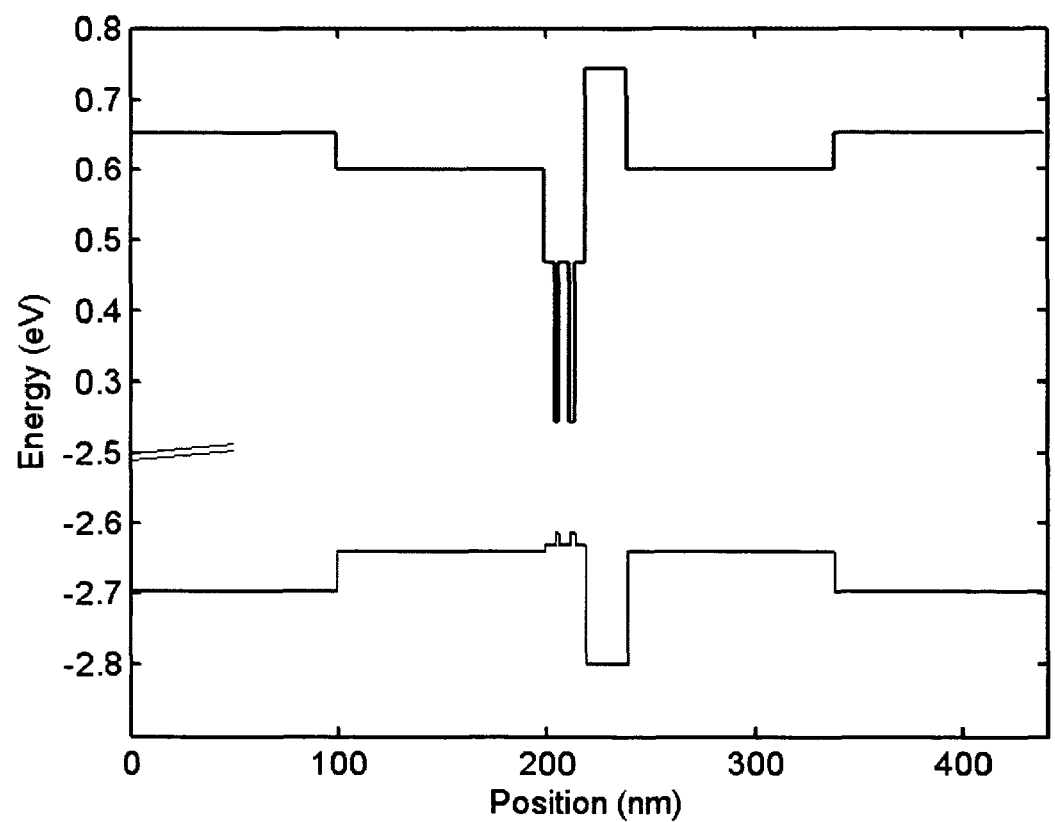
FIG. 22 shows an exemplary simulated energy band diagram of reference QW structure in zinc blende form, as listed in FIG. 33, with an $Al_{0.2}Ga_{0.8}N$ electron blocking layer.

All the above embodiments can also be implemented in zincblende nitride structures as well. FIG. 22 shows simulated band diagram for the typical zincblende structure listed in Table 1. A typical electron blocking layer also blocks holes in the valence band essentially due to lack of band alignment in the valence band.

Figure 23:
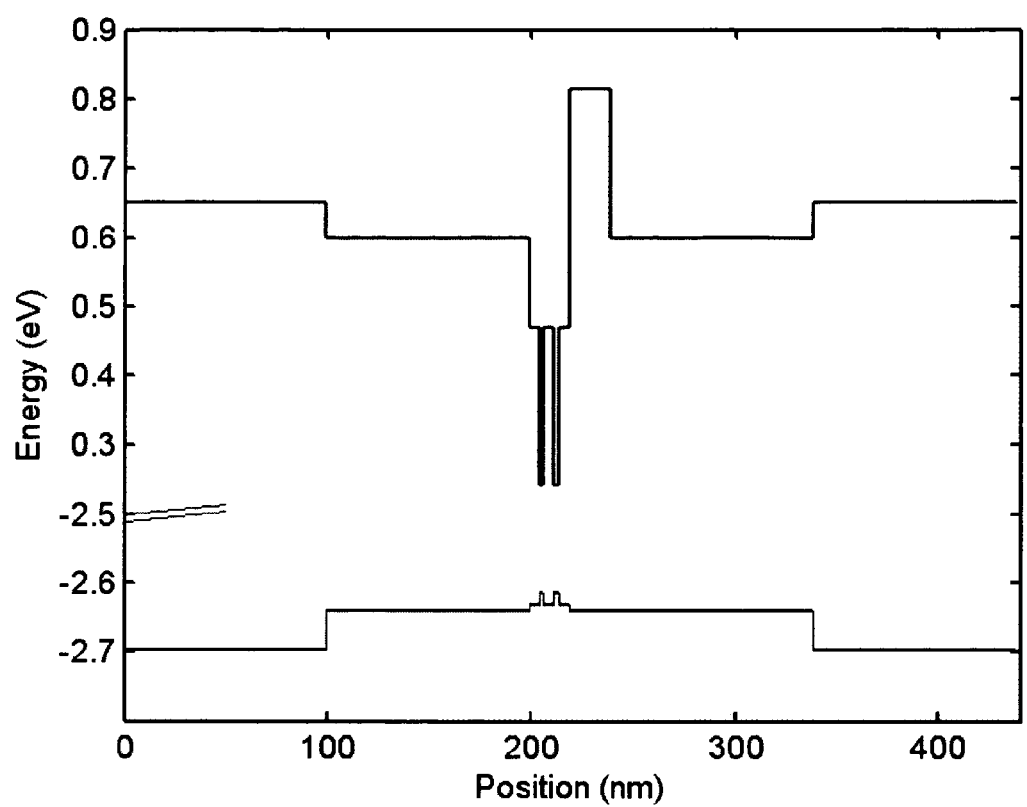
FIG. 23 shows an exemplary simulated energy band diagram of reference QW structure in zinc blende form, as listed in FIG. 33, with band-edge aligned electron blocking layer $Al_{0.2}Ga_{0.8}N_{0.944}Sb_{0.056}$ in accordance with the invention.
Figure 24:
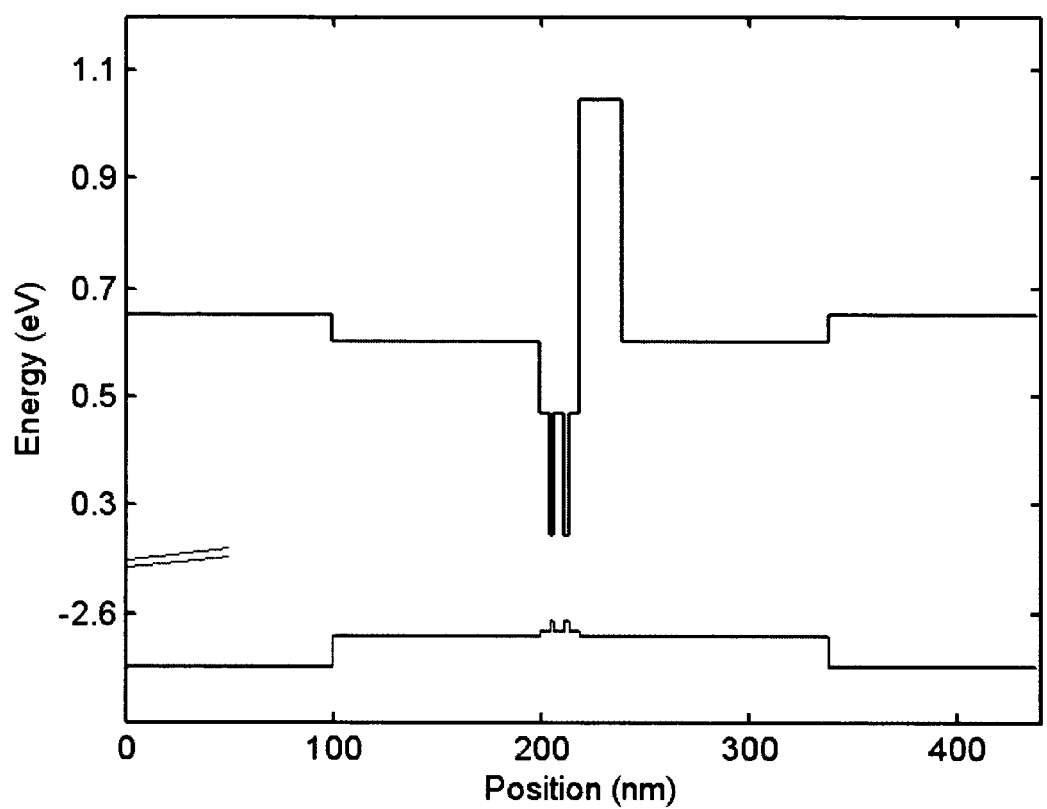
FIG. 24 shows an exemplary simulated energy band diagram of reference QW structure in zinc blende form, as listed in FIG. 33, with band-edge aligned electron blocking layer using $Al_{0.4}Ga_{0.6}N_{0.893}Sb_{0.107}$ in accordance with the invention.
Figure 25:
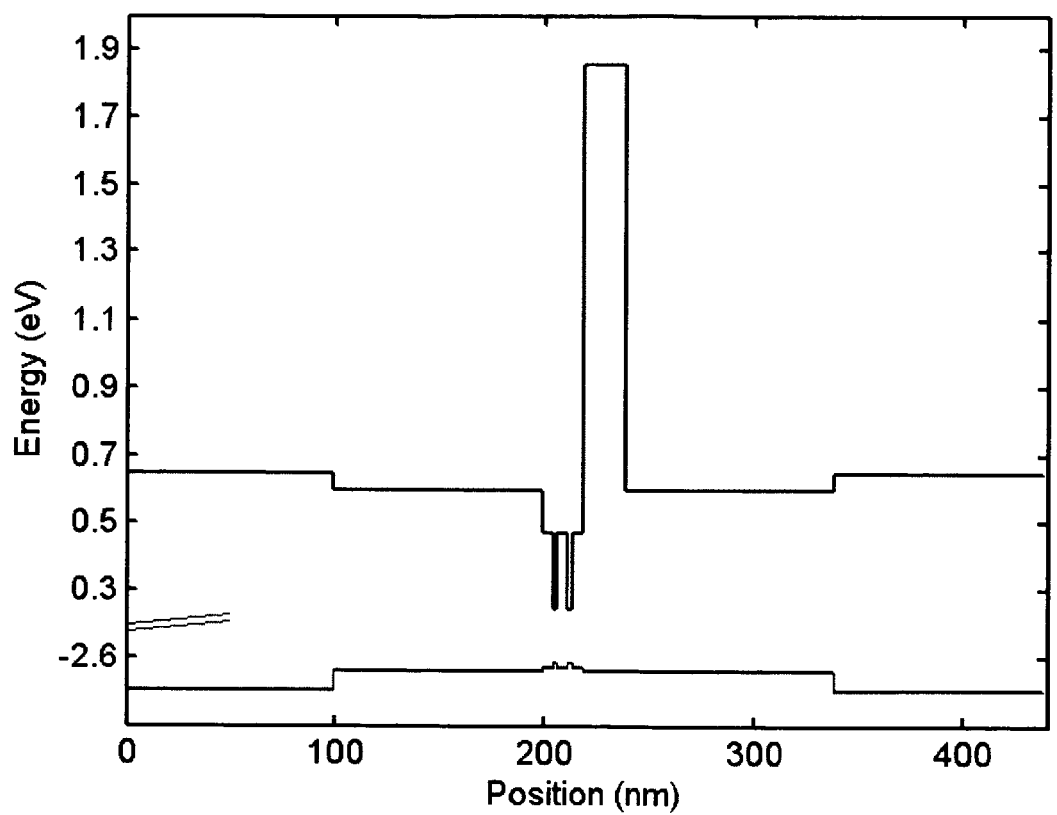
FIG. 25 shows an exemplary simulated energy band diagram of reference QW structure in zinc blende form, as listed in FIG. 33, with band-edge aligned electron blocking layer using $AlN_{0.759}Sb_{0.241}$ in accordance with the invention.

FIG. 23-FIG. 32 show the simulations based on zincblende nitride parameters in accordance with the invention. FIG. 23 illustrates a simulated band diagram of our reference QW structure (Table 1) with band-aligned electron blocking layer using $Al_{0.2}Ga_{0.8}N_{0.944}Sb_{0.056}$ Instead of 7% of Sb in wurtzite structure, zincblende needs only 5.6% for complete band alignment. This is due to the fact that in zincblende structures the effect of strain on band-gap and band off-set is not as big as we see in wurtzite structures. Al content of 40% in the AlGaN electron blocking layer requires only 10.7% Sb in the group V compounds to completely line-up its valence band-edge with that of adjacent waveguide layer as illustrated in FIG. 24. Even 100% Al in the electron blocking layer still lines up the valence band edge by mere addition of 24.1% of Sb as we see in FIG. 25. The amount of permissible Sb in the blocking layer will be determined by a number of factors such as strain and its effect on overall piezo-electric field.

Figure 26:
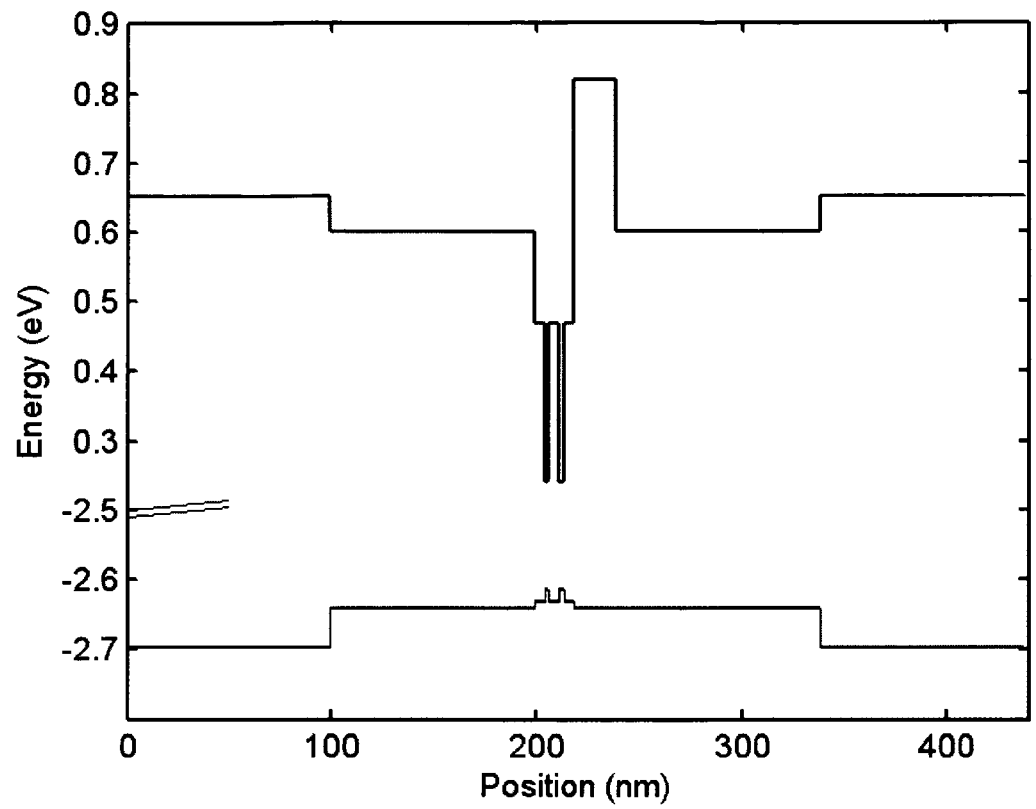
FIG. 26 shows an exemplary simulated energy band diagram of reference QW structure in zinc blende form, as listed in FIG. 33, with band-edge aligned electron blocking layer using $Al_{0.2}Ga_{0.8}N_{0.917}As_{0.083}$ in accordance with the invention.
Figure 27:
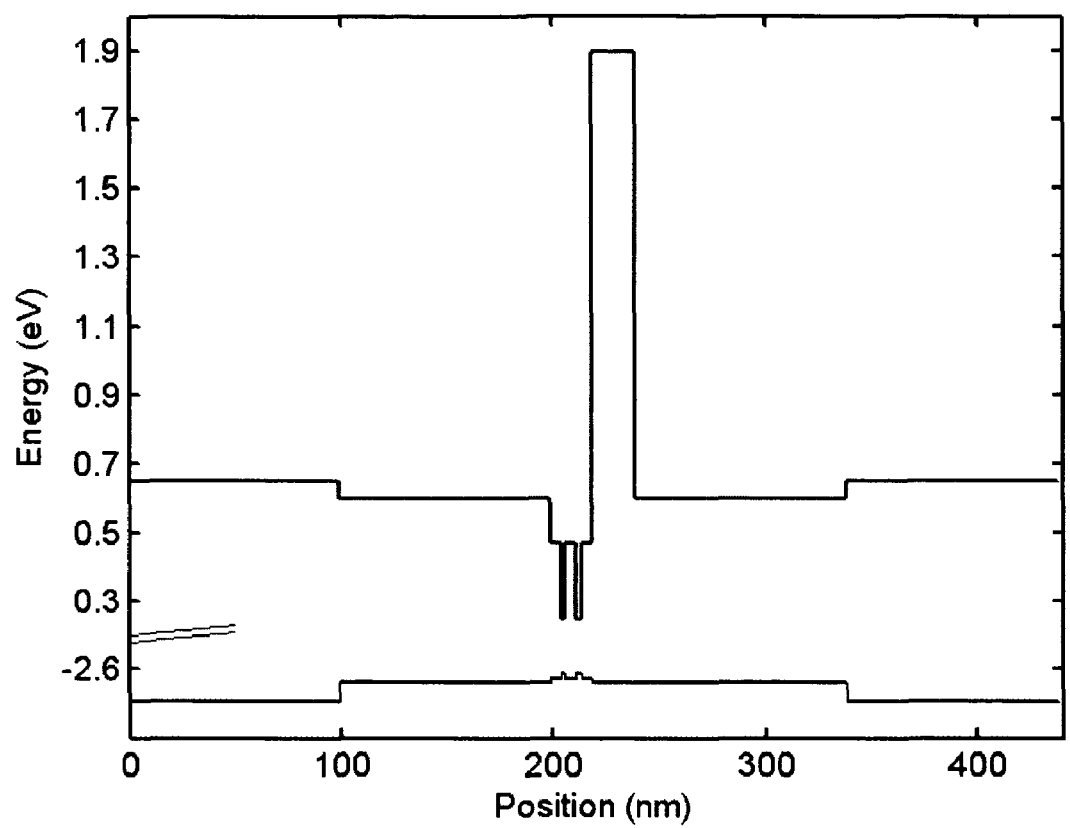
FIG. 27 shows an exemplary simulated energy band diagram of reference QW structure in zinc blende form, as listed in FIG. 33, with band-edge aligned electron blocking layer using $AlN_{0.653}As_{0.347}$ in accordance with the invention.

In similar manner, addition of As also helps in alignment of the valence band edge of the AlGaN electron blocking layer. More the content of Al in the layer, more As needed to band-align the valence band edge with that of waveguide layer. As illustrated in FIG. 26 and FIG. 27, addition of 8.3% and 34.7% of As in group V help line-up the valence band of the electron blocking layer with 20% and 100% Al respectively.

Figure 28:
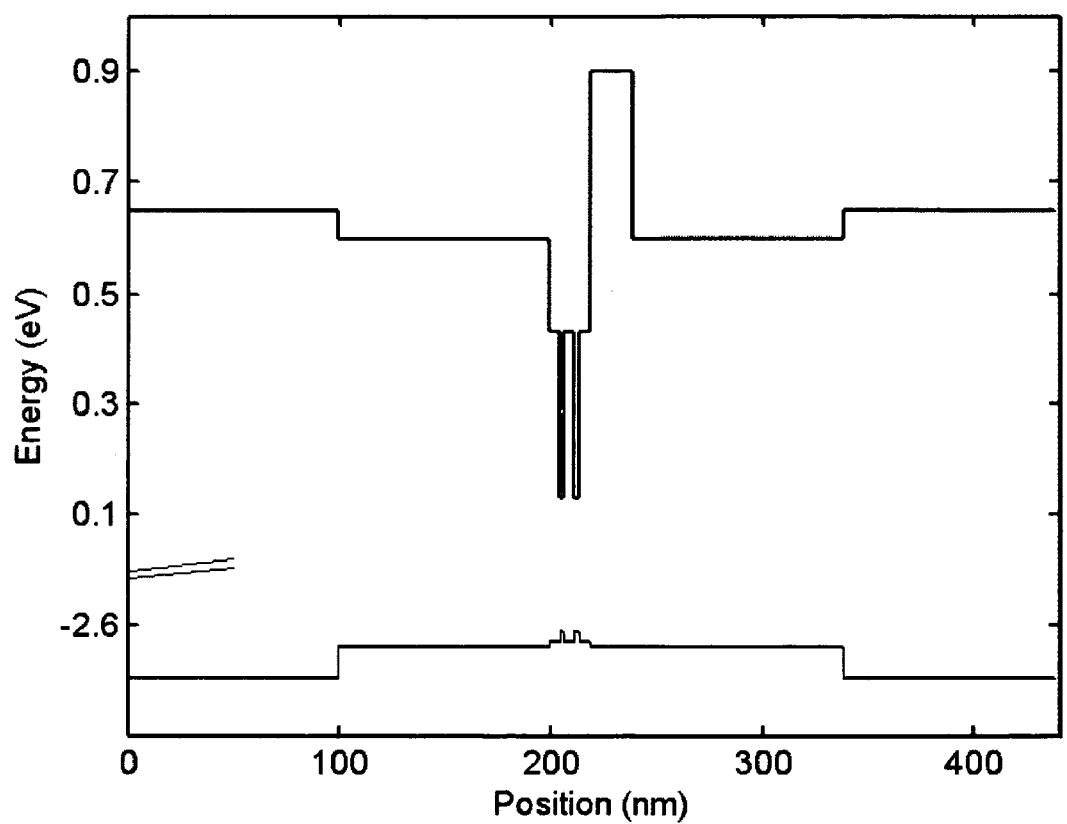
FIG. 28 shows an exemplary simulated energy band diagram of reference QW structure in zinc blende form, as listed in FIG. 33, with band-edge aligned electron blocking layer using $Al_{0.2}Ga_{0.8}N_{0.893}PO_{0.107}$ in accordance with the invention.
Figure 29:
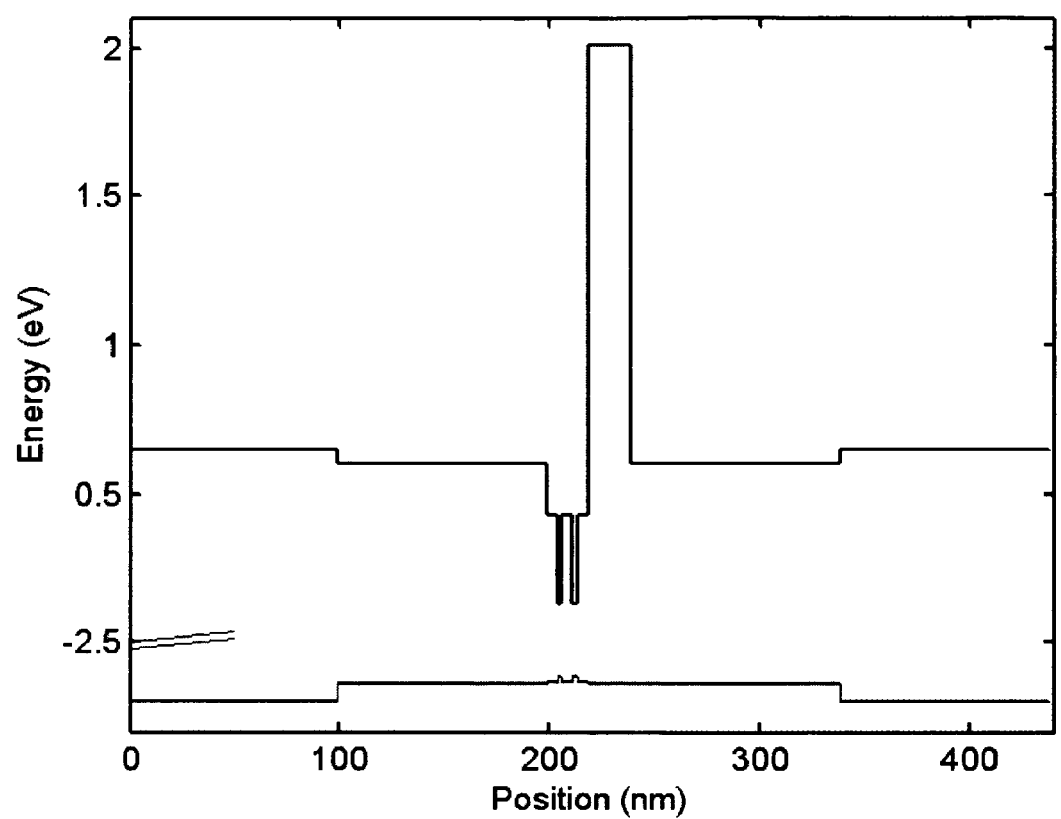
FIG. 29 shows an exemplary simulated energy band diagram of reference QW structure in zinc blende form, as listed in FIG. 33, with band-edge aligned electron blocking layer using $AlN_{0.588}P_{0.412}$ in accordance with the invention.

Similarly, as illustrated in FIG. 28 and FIG. 29, addition of 10.7% and 41.2% of P in group V help line-up the valence band of the electron blocking layer with 20% and 100% Al respectively.

As, P, Sb or a combination of these elements can also be used in multiple electron blocking layers to line up the valence band.

Figure 30:
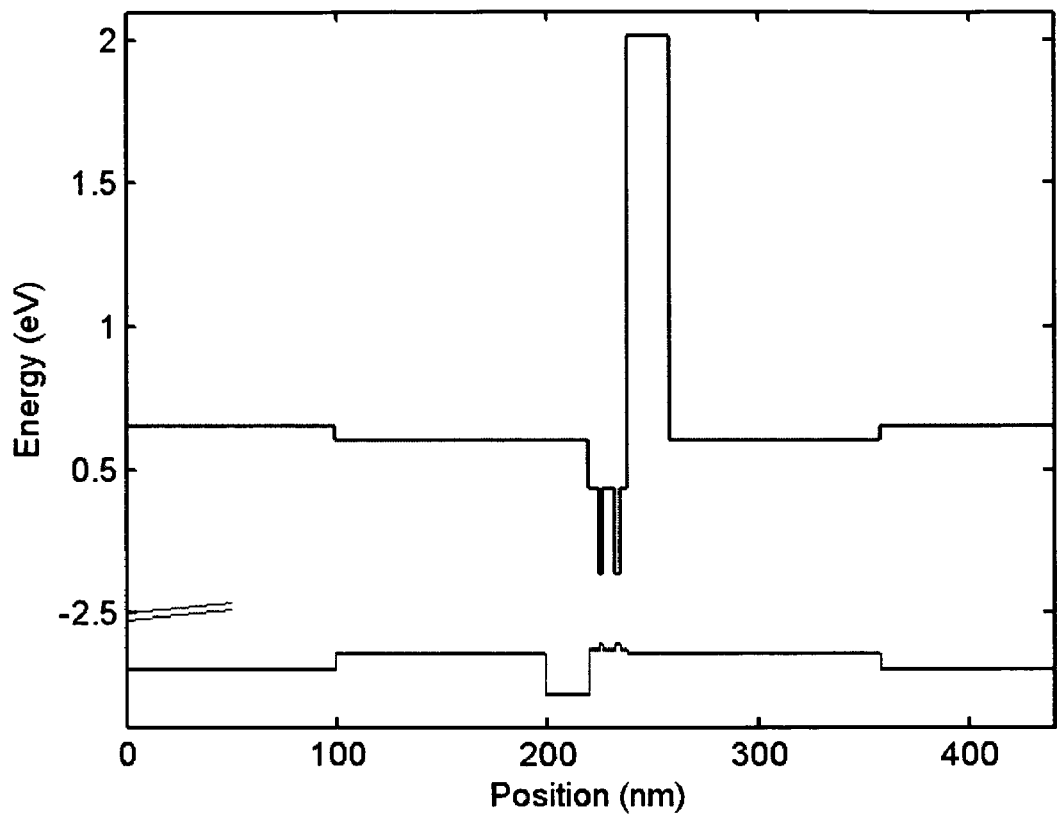
FIG. 30 shows an exemplary simulated energy band diagram of reference QW structure in zinc blende form, as listed in FIG. 33, with band-edge aligned electron blocking layer using $AlN_{0.588}P_{0.412}$ and band-edge aligned hole blocking layer using $In_{0.052}Al_{0.2}Ga_{0.748}N$ in accordance with the invention.
Figure 31:
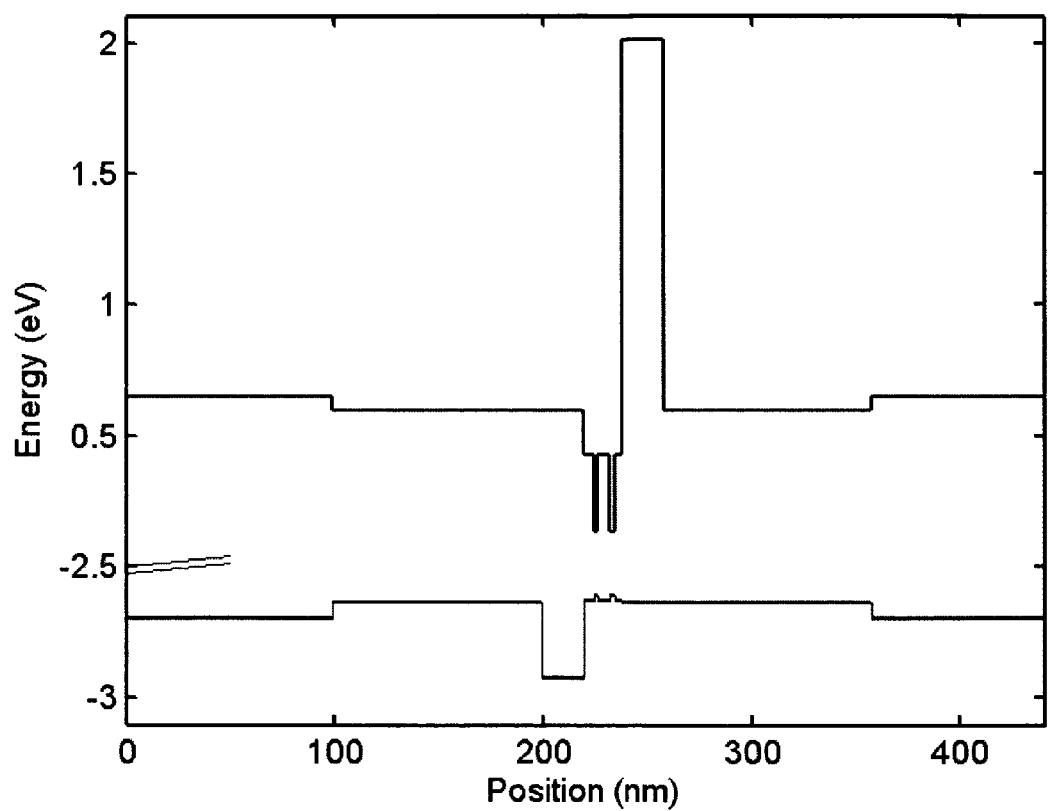
FIG. 31 shows an exemplary simulated energy band diagram of reference QW structure in zinc blende form, as listed in FIG. 33, with band-edge aligned electron blocking layer using $AlN_{0.586}P_{0.414}$ and band-edge aligned hole blocking layer using $In_{0.132}Al_{0.4}Ga_{0.468}N$ in accordance with the invention.
Figure 32:
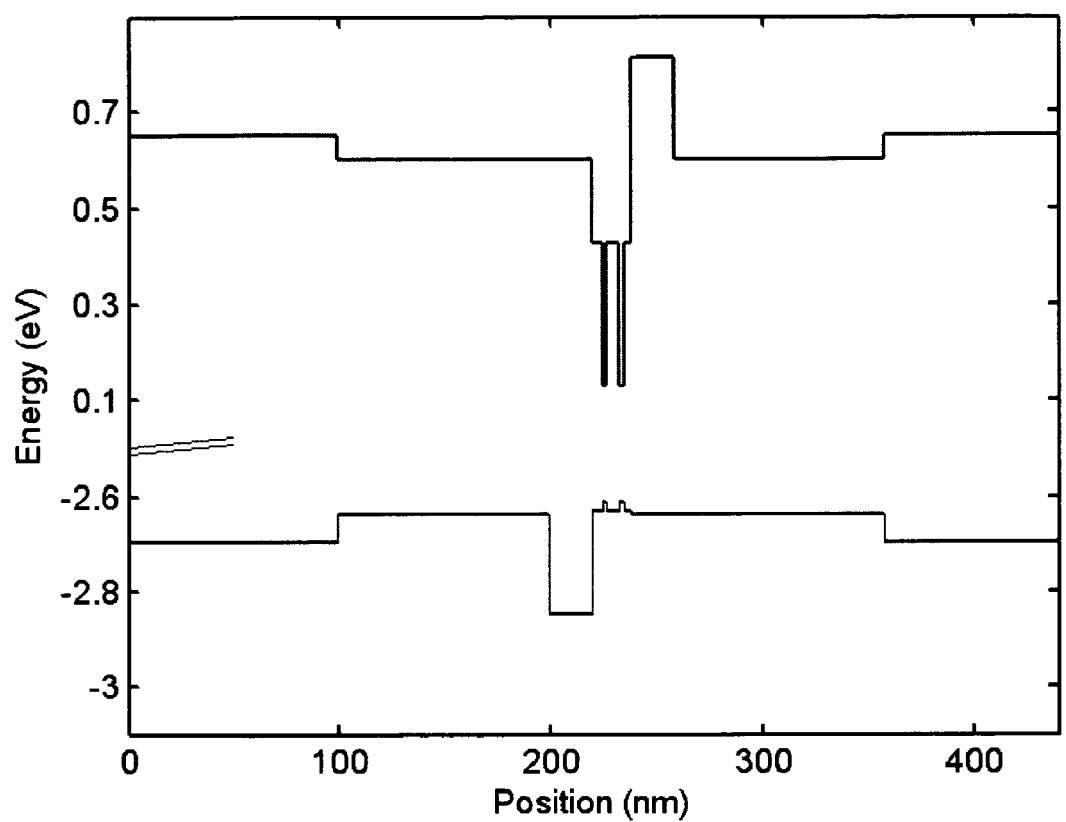
FIG. 32 shows an exemplary simulated energy band diagram of reference QW structure in zinc blende form, as listed in FIG. 33, with band-edge aligned electron blocking layer using $Al_{0.2}Ga_{0.8}N_{0.9435}Sb_{0.0565}$ and band-edge aligned hole blocking layer using $In_{0.514}Al_{0.486}N$ in accordance with the invention.

In another embodiment exemplification for zinc blende structure, illustrated in FIG. 30-FIG. 32, In, in various compositions, is used to line-up the conduction band edge of a proposed hole-blocking layer to that of near-by waveguide layer. As seen in the simulations, as low as 5.2% of In is needed to be added to $Al_{0.2}Ga_{0.8}N$ hole blocking layer, with In replacing Ga, to completely band-align the conduction band-edge of the hole blocking layer with that of adjacent GaN waveguide layer. Similarly, 13.2% of In needs to be added in the $Al_{0.4}Ga_{0.6}N$ hole blocking layer, with In replacing Ga, to band-align the conduction band-edge of hole blocking layer with that of the GaN waveguide layer. Complete absence of Ga in the hole blocking layer needs 51.4% of In to band-align the conduction band-edge with that of adjacent GaN waveguide layer.

FIG. 30-FIG. 32 illustrate the simulation of band-aligned hole blocking layers along with band aligned electron blocking layers with various compositions of In, P and Sb.

The simulations described herein are exemplary and numerous modifications, variations, differing material databases and re-arrangements can yield to different molar fractions of compounds involved.

The embodiments of the invention described herein are also exemplary and numerous modifications, variations and rearrangements can be readily envisioned to achieve substantially equivalent results, all of which are intended to be embraced within the spirit and scope of the invention as defined in the appended claims.

The invention claimed is:

1. A nitride semiconductor light processing device formed of a hexagonal or cubic crystal system, comprising:
   a substrate;
   a light emitting layer comprising a quantum well structure including quantum well layers and barrier layers laminated alternately;
   at least one electron blocking layer, sandwiched in between a first waveguide layer and a light emitting layer;
   wherein said light emitting layer and said electron blocking layer are sandwiched in between the first waveguide layer and a second waveguide layer;
   wherein one or more of said quantum well layers comprises a nitride semiconductor material;
   wherein one or more of said barrier layers comprises a nitride semiconductor material;
   wherein said electron blocking layer is formed of a layer containing Sb and a plurality of group III and V elements;
   wherein the molar fraction of Sb is more than 0.01% and less than 35% of the total group V elements in said electron blocking layer; and
   wherein the valence band edge of said electron blocking layer is, partially or fully, aligned with a valence band edge of either said barrier layer or said waveguide layer.

2. The device of claim 1, wherein the light processing device is constructed to form one of:
   a light emitting device;
   a light receiving device;
   a light sensing device; and
   a light modulating device.

3. The device of claim 1, wherein the quantum well layers comprise one of GaN or InGaN or InAlGaN.

4. The device of claim 1, wherein the barrier layer comprises at least one of GaN, InGaN, AlGaN, or InAlGaN, InAlGaNAs, InAlGaNP, and InAlGaNSb.

5. The device of claim 1, wherein the said electron blocking layer is formed of a layer further containing As; wherein the molar fraction of As is more than 0.01% and less than 50% of the total group V elements in this layer; and wherein a valence band edge of said electron blocking layer is, partially or fully, aligned with a valence band edge of either said barrier layer or said waveguide layer.

6. The device of claim 1, wherein the said electron blocking layer is formed of a layer containing a combination of As, P and Sb; wherein the molar fraction of the said combination is more than 0.01% and less than 61% of the total group V elements in said electron blocking layer; and wherein the valence band edge of electron blocking layer is, partially or fully, aligned with a valence band edge of either the barrier layer or the waveguide layer.

7. The device of claim 1, wherein said light emitting layer includes at least one and a maximum of 12 said quantum well layers and wherein said light emitting layer includes at least zero and a maximum of 13 said barrier layers.

8. The device of claim 1, wherein said substrate is formed of GaN or Sapphire or SiC.

9. The device of claim 1, wherein the electron blocking layer comprises a plurality of electron blocking layers comprising at least one of elements P, As, and Sb.

10. The device of claim 9, wherein the plurality of electron blocking layers refers to a superlattice of thin blocking layers of at least 2 and maximum of 15.

11. The device of claim 1, wherein each of said one or more quantum well layers has a thickness of more than 0.4 nm and less than 20 nm, and each of said one or more barrier layers has a thickness of more than 0.4 nm and less than 20 nm.

12. The device of claim 1, wherein:
the first waveguide layer comprises a p-type nitride semiconductor layer situated farther from said substrate and in contact with at least one of said electron blocking layer and said barrier layer, wherein each waveguide layer having a band-gap larger than that of the quantum well layer.

13. The device of claim 1, further comprising:
a n-type semiconductor layer containing Al in contact with said first waveguide layer; and
a p-type semiconductor layer containing Al in contact with said second waveguide layer, wherein each cladding layer comprises a band-gap larger than that of the waveguide layers.

14. A nitride semiconductor light processing device formed of a hexagonal or cubic crystal system, comprising:
a substrate;
a light emitting layer comprising a quantum well structure including quantum well layers and barrier layers laminated alternately;
at least one electron blocking layer sandwiched in between a first waveguide layer and a light emitting layer;
wherein said light emitting layer and said electron blocking layer are sandwiched in between the first waveguide layer and a second waveguide layer;
wherein one or more of said quantum well layers comprises a nitride semiconductor material;
wherein one or more of said barrier layers comprises a nitride semiconductor material;
wherein said electron blocking layer is formed of a layer containing P and a plurality of group III and V elements;
wherein the molar fraction of P is more than 0.01% and less than 60% of the total group V elements in said electron blocking layer; and
wherein a valence band edge of said electron blocking layer is, partially or fully, aligned with a valence band edge of one barrier or waveguide layer.

15. The device of claim 14, wherein the electron blocking layer comprises a plurality of electron blocking layers comprising at least one of elements P, As, and Sb.

16. The device of claim 15, wherein the plurality of electron blocking layers refers to a superlattice of thin blocking layers of at least 2 and maximum of 15.

17. A nitride semiconductor light processing device formed of a hexagonal or cubic crystal system, comprising:
a substrate;
a light emitting layer comprising a quantum well structure including quantum well layers and barrier layers laminated alternately;
at least one hole blocking layer sandwiched in between a second waveguide layer and a light emitting layer;
wherein said light emitting layer and said hole blocking layer are sandwiched in between the first waveguide layer and a second waveguide layer;
wherein one or more of said quantum well layers comprises a nitride semiconductor material;
wherein one or more of said barrier layers comprises a nitride semiconductor material;
wherein said hole blocking layer is formed of a layer containing In and a plurality of group III and V elements;
wherein the molar fraction of In is more than 0.01% and less than 60% of the total group III elements in said electron blocking layer; and
wherein the conduction band edge of said hole blocking layer is, partially or fully, aligned with a valence band edge of either the barrier layer or the waveguide layer.

18. The device of claim 17, wherein the hole blocking layer comprises a plurality hole blocking layers comprising In.

19. The device of claim 18, wherein the plurality of hole blocking layers comprises a superlattice of at least 2 and at most 15 thin blocking layers.

20. The device of claim 17, wherein:
the second waveguide layer comprises a n-type nitride semiconductor layer situated closer to said substrate and in contact with said hole blocking layer.

* * * * *